United States Patent
Lapstun et al.

(10) Patent No.: US 8,325,359 B2
(45) Date of Patent: *Dec. 4, 2012

(54) HANDHELD PRINTER FOR PRINTING BOTH AN IMAGE AND POSITION-CODING PATTERN

(75) Inventors: Paul Lapstun, Balmain (AU); Kia Silverbrook, Balmain (AU)

(73) Assignee: Silverbrook Research Pty Ltd, Balmain, New South Wales (AU)

( * ) Notice: Subject to any disclaimer, the term of this patent is extended or adjusted under 35 U.S.C. 154(b) by 1020 days.

This patent is subject to a terminal disclaimer.

(21) Appl. No.: 12/178,610

(22) Filed: Jul. 24, 2008

(65) Prior Publication Data

US 2009/0034000 A1   Feb. 5, 2009

Related U.S. Application Data

(60) Provisional application No. 60/953,443, filed on Aug. 1, 2007, provisional application No. 60/974,077, filed on Sep. 21, 2007.

(51) Int. Cl.
G06F 3/12 (2006.01)
(52) U.S. Cl. ........ 358/1.15; 358/1.18; 358/1.4; 347/109
(58) Field of Classification Search ............... 358/1.4
See application file for complete search history.

(56) References Cited

U.S. PATENT DOCUMENTS

| | | |
|---|---|---|
| 4,838,791 A | 6/1989 | Bogosian et al. |
| 4,864,618 A | 9/1989 | Wright et al. |
| 5,051,736 A | 9/1991 | Bennett et al. |
| 5,477,012 A | 12/1995 | Sekendur |
| 5,652,412 A | 7/1997 | Lazzouni et al. |
| 5,661,506 A | 8/1997 | Lazzouni et al. |
| 5,692,073 A | 11/1997 | Cass |
| 5,710,582 A | 1/1998 | Hawkins et al. |
| 5,852,434 A | 12/1998 | Sekendur |
| 5,912,672 A | 6/1999 | Liguori |
| 6,002,124 A | 12/1999 | Bohn et al. |
| 6,076,734 A | 6/2000 | Dougherty et al. |

(Continued)

FOREIGN PATENT DOCUMENTS

GB    2306669 A    5/1997

(Continued)

OTHER PUBLICATIONS

Dymetman, M., and Copperman, M., "Intelligent Paper in Electronic Publishing, Artist Imaging, and Digital Typography, Proceedings of EP '98", Mar./Apr. 1998, Springer Verlag LNCS 1375, pp. 392-406.

(Continued)

*Primary Examiner* — Twyler Haskins
*Assistant Examiner* — Nicholas Pachol

(57) ABSTRACT

A swipe printer comprising: (a) a printhead for printing a graphic image and a position-coding pattern onto a surface; (b) an ink supply containing a first ink for printing the graphic image and a second ink for printing the position-coding pattern; (c) an image sensor positioned for imaging portions of the surface on which the printhead has printed during a swipe of the surface, each imaged portion containing part of the position-coding pattern printed by the printhead during the swipe; and (d) a processor for determining absolute positions of the swipe printer using the parts of the position-coding pattern. The processor is configured to use the absolute positions for controlling an output of the printhead during the swipe.

19 Claims, 7 Drawing Sheets

U.S. PATENT DOCUMENTS

| | | | |
|---|---|---|---|
| 6,104,845 A | 8/2000 | Lipman et al. | |
| 6,109,722 A * | 8/2000 | Underwood et al. | 347/19 |
| 6,309,809 B1 | 10/2001 | Starikov et al. | |
| 6,429,422 B1 | 8/2002 | Bohn | |
| 6,560,374 B1 | 5/2003 | Enomoto | |
| 6,806,453 B1 * | 10/2004 | Vincent et al. | 250/208.1 |
| 6,822,768 B1 | 11/2004 | McCoy | |
| 6,832,717 B1 | 12/2004 | Silverbrook et al. | |
| 6,836,555 B2 | 12/2004 | Ericson et al. | |
| 6,878,922 B1 | 4/2005 | Bohn | |
| 6,964,374 B1 | 11/2005 | Djuknic et al. | |
| 6,965,460 B1 | 11/2005 | Gann et al. | |
| 6,992,655 B2 | 1/2006 | Ericson et al. | |
| 7,015,969 B2 | 3/2006 | Brown et al. | |
| 7,054,487 B2 | 5/2006 | Ericson et al. | |
| 7,140,543 B2 | 11/2006 | Giordano et al. | |
| 7,168,776 B2 | 1/2007 | Mitsuzawa | |
| 7,176,896 B1 | 2/2007 | Fahraeus et al. | |
| 7,236,271 B2 | 6/2007 | Silverbrook | |
| 7,296,744 B2 | 11/2007 | He et al. | |
| 7,342,575 B1 | 3/2008 | Hartwell et al. | |
| 7,367,509 B2 | 5/2008 | Patel et al. | |
| 7,578,444 B2 | 8/2009 | Joseph et al. | |
| 7,649,337 B2 | 1/2010 | Uehlein-Proctor et al. | |
| 7,649,637 B2 | 1/2010 | Wiebe et al. | |
| 7,710,408 B2 | 5/2010 | Ericson | |
| 7,743,990 B2 | 6/2010 | Schnee et al. | |
| 7,753,283 B2 | 7/2010 | Lynggaard | |
| 7,876,472 B2 * | 1/2011 | Gudan et al. | 358/1.15 |
| 7,894,095 B2 | 2/2011 | Silverbrook et al. | |
| 7,997,490 B2 * | 8/2011 | Lapstun et al. | 235/454 |
| 2001/0055036 A1 * | 12/2001 | Burstrom | 345/758 |
| 2002/0159089 A1 * | 10/2002 | Wiebe et al. | 358/1.15 |
| 2002/0171731 A1 * | 11/2002 | Saund | 347/109 |
| 2003/0193612 A1 | 10/2003 | Oliver | |
| 2004/0022452 A1 | 2/2004 | McCoy | |
| 2004/0174556 A1 | 9/2004 | Lapstun et al. | |
| 2004/0196501 A1 | 10/2004 | Silverbrook et al. | |
| 2005/0018033 A1 * | 1/2005 | Walling | 347/109 |
| 2005/0057595 A1 | 3/2005 | De Grijs | |
| 2005/0057600 A1 * | 3/2005 | Teshigawara et al. | 347/19 |
| 2005/0106365 A1 * | 5/2005 | Palmer et al. | 428/195.1 |
| 2005/0120295 A1 * | 6/2005 | Sako et al. | 715/507 |
| 2005/0135857 A1 * | 6/2005 | Saund et al. | 400/88 |
| 2005/0141060 A1 * | 6/2005 | Rydbeck et al. | 358/512 |
| 2005/0200893 A1 | 9/2005 | Silverbrook et al. | |
| 2006/0012562 A1 | 1/2006 | Pope et al. | |
| 2006/0038842 A1 * | 2/2006 | Chikuma et al. | 347/12 |
| 2006/0250640 A1 * | 11/2006 | Lapstun et al. | 358/1.15 |
| 2007/0047002 A1 | 3/2007 | Hull et al. | |
| 2008/0055384 A1 * | 3/2008 | Noe et al. | 347/109 |
| 2008/0273051 A1 * | 11/2008 | Teshigawara et al. | 347/14 |
| 2010/0079807 A1 * | 4/2010 | Wiebe et al. | 358/1.15 |

FOREIGN PATENT DOCUMENTS

| | | |
|---|---|---|
| JP | 2006/088509 A | 4/2006 |
| WO | WO 99/18487 A2 | 4/1999 |
| WO | WO 99/50787 A1 | 10/1999 |
| WO | WO 2007-039444 | 4/2007 |

OTHER PUBLICATIONS

U.S. Appl. No. 12/178,625, filed Feb. 5, 2009, Lapstun, Paul.
U.S. Appl. No. 12/178,618, filed Feb. 5, 2009, Lapstun, Paul.

* cited by examiner

HANDHELD PRINTER FOR PRINTING BOTH AN IMAGE AND POSITION-CODING PATTERN

CROSS-REFERENCE TO RELATED PATENT APPLICATIONS

The present application claims the right of priority under 35 U.S.C. §119(e) based on U.S. Provisional Patent Application No. 60/953, 443 filed on Aug. 1, 2007 and U.S. Provisional Patent Application No. 60/974,077, filed Sep. 21, 2007 which is incorporated by reference herein in its entirety as if fully set forth herein.

FIELD OF INVENTION

The present invention relates to a swipe printer and a swipe scanner. It has been developed primarily for improving the accuracy and functionality of swipe-printing and/or swipe-scanning.

CO-PENDING APPLICATIONS

The following applications have been filed by the Applicant simultaneously with the present application:

| | | | | |
|---|---|---|---|---|
| NPT087US | NPT088US | NPT089US | NPT090US | NPT092US |
| NPT093US | NPT094US | NPT095US | NPT096US | NPT097US |
| NPS151US | NPP091US | NPP092US | NPP093US | NPP094US |
| NPP095US | NPP096US | NPP097US | NPS149US | NPS150US |
| NPZ032US | NPZ033US | NPP099US | NPP100US | NPP101US |
| NPP102US | NPP103US | NPP104US | NPP105US | NPP106US |
| NPP107US | NPP108US | | | |

The disclosures of these co-pending applications are incorporated herein by reference. The above applications have been identified by their filing docket number, which will be substituted with the corresponding application number, once assigned.

CROSS REFERENCES

The following patents or patent applications filed by the applicant or assignee of the present invention are hereby incorporated by cross-reference.

| | | | | |
|---|---|---|---|---|
| 10/815,621 | 10/815,635 | 10/815,647 | 11/488,162 | 10/815,636 |
| 11/041,652 | 11/041,609 | 11/041,556 | 10/815,609 | 7,204,941 |
| 7,278,727 | 10/913,380 | 7,122,076 | 7,156,289 | 09/575,197 |
| 6,720,985 | 7,295,839 | 09/722,174 | 7,068,382 | 7,094,910 |
| 7,062,651 | 6,644,642 | 6,549,935 | 6,987,573 | 6,727,996 |
| 6,760,119 | 7,064,851 | 6,290,349 | 6,428,155 | 6,785,016 |
| 6,831,682 | 6,741,871 | 6,965,439 | 10/932,044 | 6,870,966 |
| 6,474,888 | 6,724,374 | 6,788,982 | 7,263,270 | 6,788,293 |
| 6,737,591 | 09/693,514 | 10/778,056 | 10/778,061 | 11/193,482 |
| 7,055,739 | 6,830,196 | 7,182,247 | 7,082,562 | 10/409,864 |
| 7,108,192 | 10/492,169 | 10/492,152 | 10/492,168 | 10/492,161 |
| 7,308,148 | 6,957,768 | 7,170,499 | 11,856,061 | 11/672,522 |
| 11/672,950 | 11/754,310 | 12,015,507 | 7,148,345 | 12,025,746 |
| 12,025,762 | 12,025,765 | 10/407,212 | 6,902,255 | 6,755,509 |

BACKGROUND

The Applicant has previously described a method of enabling users to access information from a computer system via a printed substrate e.g. paper. The substrate has a coding pattern printed thereon, which is read by an optical sensing device when the user interacts with the substrate using the sensing device. A computer receives interaction data from the sensing device and uses this data to determine what action is being requested by the user. For example, a user may make make handwritten input onto a form or make a selection gesture around a printed item. This input is interpreted by the computer system with reference to a page description corresponding to the printed substrate.

It would desirable to provide a convenient means for printing and/or scanning interactive pages of this type. It would further be desirable to provide a means for conferring interactivity onto 'normal' pre-printed graphic images.

SUMMARY OF INVENTION

In a first aspect the present invention provides a swipe printer comprising:
 a printhead for printing a graphic image and a position-coding pattern onto a surface;
 an ink supply containing at least one first ink for printing the graphic image and a second ink for printing the position-coding pattern;
 at least one first image sensor positioned for imaging portions of said surface on which said printhead has printed during a swipe of the surface, each imaged portion containing part of the position-coding pattern printed by said printhead during said swipe; and
 a processor for determining absolute positions of the swipe printer using said parts of the position-coding pattern,
 wherein the processor is configured to use the absolute positions for controlling an output of said printhead during said swipe.

Optionally, said second ink is an infrared-absorbing ink.

Optionally, the or each first ink has an infrared window enabling said first image sensor to image said position-coding pattern in the presence of the first ink.

Optionally, the swipe printer is configured for unidirectional swiping.

Optionally, said first image sensor is positioned downstream of said printhead, wherein a swipe direction is defined as upstream.

Optionally, the swipe printer further comprising a motion sensor for sensing relative motion of the printer.

Optionally, said processor is configured to use the sensed relative motion together with said absolute positions to control the output of the said printhead.

Optionally, said position-coding pattern further identifies an orientation of position data relative to a grid containing said position data.

Optionally, said processor is configured to use said part of the position-coding pattern to determine an orientation of the printer relative to said grid, and to use said orientation together with said absolute position to control the output of the said printhead.

Optionally, said position-coding pattern further identifies an impression identity associated with said graphic image.

Optionally, the swipe printer, further comprising a first memory for storing a plurality of impression identities, each stored impression identity being associable with a graphic image.

Optionally, the swipe printer, further comprising communication means for communicating with a computer system.

Optionally, said processor is configured to generate association data for communication to the computer system, said association data indicating an association between the impression identity and the graphic image such that said graphic image printed by said printer is interactive.

Optionally, said association data enables said computer system to associate one or more zones of the graphic image with a corresponding interactive element.

Optionally, said interactive element is selected from the group comprising: a hyperlink, an input field and a button.

Optionally, the swipe printer, further comprising a second image sensor configured for scanning the graphic image printed by said printer.

Optionally, said second image sensor is positioned parallel and/or substantially coextensive with said printhead.

Optionally, said printhead is configured for printing the graphic image and the position-coding pattern substantially simultaneously onto said surface during said swipe.

In a further aspect there is provided a handheld device comprising the swipe printer.

In a further aspect there is provided a handheld device, which is selected from the group comprising: a mobile phone and a personal digital assistant.

In a second aspect the present invention provides a swipe scanner comprising:
- a printhead for printing a position-coding pattern onto a surface;
- an ink supply containing an ink for printing the position-coding pattern;
- at least one first image sensor positioned for imaging portions of said surface on which said printhead has printed during a swipe of the surface, each imaged portion containing part of the position-coding pattern printed by said printhead during said swipe;
- at least one second image sensor for capturing, during said swipe, portions of a graphic image pre-printed on said surface; and
- a processor configured for:
  - determining absolute positions of the swipe scanner using said parts of the position-coding pattern;
  - using the absolute positions to control an output of said printhead during said swipe; and
  - using the absolute positions to assemble said captured portions of said graphic image into a scanned graphic image.

Optionally, said ink is an infrared-absorbing ink.

Optionally, said graphic image is printed with one or more colored inks having an infrared window, thereby enabling imaging of said position-coding pattern in the presence of said colored inks.

Optionally, the swipe scanner is configured for unidirectional swiping.

Optionally, said first image sensor is positioned downstream of said printhead, wherein a swipe direction is defined as upstream.

In another aspect the swipe scanner further comprising a motion sensor for sensing relative motion of the scanner.

Optionally, said processor is configured to use relative motion data together with said absolute positions to control the output of the said printhead and to assemble said captured portions.

Optionally, said position-coding pattern further identifies an orientation of position data relative to a grid containing said position data.

Optionally, said processor is configured to use each part of the position-coding pattern to determine an orientation of the scanner relative to said grid, and to use said orientation together with said absolute position to control the output of the said printhead and to assemble said captured portions.

Optionally, said position-coding pattern further identifies an impression identity associated with said graphic image.

In a further aspect the swipe scanner further comprising a first memory for storing a plurality of impression identities, each stored impression identity being associable with a graphic image.

In another aspect the swipe scanner further comprising communication means for communicating with a computer system.

Optionally, said processor is configured to generate association data for communication to the computer system, said association data indicating an association between the impression identity, the absolute positions and the scanned graphic image, such that said graphic image scanned by said printer is interactive.

Optionally, said association data enables said computer system to associate one or more zones of the graphic image with a corresponding interactive element.

Optionally, said interactive element is selected from the group comprising: a hyperlink, an input field and a button.

Optionally, said second image sensor is a linear image sensor.

Optionally, said second image sensor is positioned parallel and/or substantially coextensive with said printhead.

In another aspect there is provided a handheld device comprising the swipe printer In a further aspect the handheld device is selected from the group comprising: a mobile phone and a personal digital assistant.

In a third aspect the present invention provides a swipe scanner for scanning a graphic image pre-printed on a surface, said swipe scanner comprising:
- a printhead for printing a position-coding pattern onto said graphic image, said position-coding pattern identifying a plurality of absolute positions and an impression identity for the graphic image;
- an ink supply containing an ink for printing the position-coding pattern;
- at least one first sensor for sensing positions of said scanner during a swipe of the surface;
- at least one second image sensor for capturing, during said swipe, portions of the graphic image; and
- a processor configured for:
  - using the sensed positions to control an output of said printhead during said swipe;
  - using the sensed positions to assemble said captured portions of said graphic image into a scanned graphic image; and
  - generating association data indicating an association between the impression identity, the plurality of absolute positions and the scanned graphic image.

Optionally, said first sensor comprises an image sensor positioned for imaging portions of said surface on which said printhead has printed during a swipe of the surface, each imaged portion containing part of the position-coding pattern printed by said printhead during said swipe.

Optionally, said first image sensor is positioned downstream of said printhead, wherein a swipe direction is defined as upstream.

Optionally, said first sensor comprises a relative motion sensor.

Optionally, said first sensor comprises an optical mouse sensor.

Optionally, said ink is an infrared-absorbing ink.

Optionally, said graphic image is printed with one or more colored inks having an infrared window, thereby enabling imaging of said position-coding pattern in the presence of said colored inks.

Optionally, the swipe scanner further comprising a first memory for storing a plurality of impression identities, each stored impression identity being associable with a graphic image.

Optionally, said ink supply comprises said first memory.

Optionally, the swipe scanner further comprising communication means for communicating with a computer system.

Optionally, said association data enables said computer system to associate one or more zones of the graphic image with a corresponding interactive element.

Optionally, said interactive element is selected from the group comprising: a hyperlink, an input field and a button.

Optionally, said computer system is configured for:
(i) performing Optical Character Recognition (OCR) on the scanned graphic image to convert text images into computer text;
(ii) generating an input description for said scanned graphic image, said input description describing words of computer text and zones of corresponding text images in the scanned graphic image; and
(iii) storing a page description comprising said input description and said scanned graphic image, said page description being indexed with said impression identity, wherein said page description is retrievable so as to confer interactivity on the graphic image.

Optionally, said computer system is further configured for:
identifying URI text strings in the computer text; and
generating the input description further describing a URI and a zone of a corresponding URI text string in the scanned graphic image.

Optionally, said second image sensor is a linear image sensor.

Optionally, said second image sensor is positioned parallel and/or substantially coextensive with said printhead.

Optionally, is manually-swipable or robotically swipable.

In a further aspect there is provided a handheld device comprising the swipe printer.

In another aspect the handheld device is selected from the group comprising: a mobile phone and a personal digital assistant.

In a fourth aspect the present invention provides a swipe scanner for scanning a graphic image printed on a surface, said surface having a position-coding pattern imposed with the graphic image, said swipe scanner comprising:
at least one first image sensor positioned for imaging portions of said surface during a swipe of the surface, each imaged portion containing part of the position-coding pattern;
at least one second image sensor for capturing, during said swipe, portions of the graphic image; and
a processor configured for:
determining absolute positions of the swipe scanner using said parts of the position-coding pattern; and
using the absolute positions to assemble said captured portions of said graphic image into a scanned graphic image.

Optionally, swipe scanner further comprising a motion sensor for sensing relative motion of the scanner.

Optionally, said processor is configured to use relative motion data together with said absolute positions to assemble said captured portions into said scanned image.

Optionally, said motion sensor comprises said first image sensor.

Optionally, said motion sensor is an optical mouse sensor.

Optionally, said position-coding pattern further identifies an orientation of position data relative to a grid containing said position data.

Optionally, said processor is configured to use each part of the position-coding pattern to determine an orientation of the scanner relative to said grid, and to use said orientation together with said absolute position to assemble said captured portions.

Optionally, said position-coding pattern further identifies an identity, said identity identifying said graphic image, said surface or a region of said surface.

Optionally, the swipe scanner further comprising communication means for communicating with a computer system.

Optionally, said second image sensor is a linear image sensor.

Optionally, said second image sensor extends substantially a width of said scanner.

In a further aspect there is provided a handheld device comprising the swipe printer.

In another aspect the handheld device is selected from the group comprising: a mobile phone and a personal digital assistant.

In a fifth aspect the present invention provides a method of printing comprising the steps of:
(i) operatively positioning a swipe printer relative to a surface and swiping the printer across the surface;
(ii) printing, during said swipe, successive parts of a position-coding pattern onto said surface;
(iii) printing, during said swipe, successive parts of a graphic image onto the surface, said position-coding pattern and said graphic image being superimposed;
(iv) imaging, during said swipe, portions of said surface on which said printhead has printed said parts of the position-coding pattern;
(v) determining, during said swipe, absolute positions of the printhead using imaged parts of the position-coding pattern; and
(vi) using the absolute positions to control, during said swipe, printing of the position-coding pattern and the graphic image.

Optionally, said printhead prints the graphic image and the position-coding pattern substantially simultaneously onto said surface.

Optionally, said surface is blank in step (i), and wherein an initial position of said swipe printer provides a reference point for said position-coding pattern.

Optionally, said reference point is an origin.

Optionally, said origin is based on an assumed initial swipe direction in step (i).

Optionally, said origin is a top-left corner of the position-coding pattern, and said initial swipe direction is a left-to-right swipe or a top-to-down swipe.

Optionally, step (i) further comprises the sub-steps of:
imaging part of a position-coding pattern printed during a previous swipe of the printer; and
determining an absolute position of the printhead,
wherein said imaged part of the position-coding pattern is contained in an outer perimeter of the position-coding pattern printed during the previous swipe.

Optionally, said swiping comprises swiping outwardly from said outer perimeter.

Optionally, said graphic image is printed with at least one first ink and said position-coding pattern is printed with a second ink.

Optionally, said second ink is an infrared-absorbing ink.

Optionally, said printer is configured for unidirectional swiping.

Optionally, said printer comprises a first image sensor for imaging said position-coding pattern, said first image sensor being positioned downstream of a printhead, wherein a swipe direction is defined as upstream.

In a further aspect there is provided a method further comprising the steps of:
- sensing relative motion of the printer during the swipe to generate relative motion data; and
- using the sensed relative motion together with said absolute positions to control printing of the position-coding pattern and the graphic image.

Optionally, the method further comprising the steps of:
- sensing an orientation of the printer relative to the position-coding pattern;
- using the orientation together with said absolute positions to control printing of the position-coding pattern and the graphic image.

Optionally, the method further comprising the steps of:
- accessing an impression identity for said graphic image;
- associating said impression identity with said graphic image;
- generating association data indicating an association between the impression identity, the absolute positions and the graphic image; and
- communicating said association data to a computer system.

Optionally, the printed position-coding pattern further identifies said impression identity.

Optionally, said association data enables said computer system to associate one or more zones of the graphic image with a corresponding interactive element.

Optionally, said interactive element is selected from the group comprising: a hyperlink, an input field and a button.

Optionally, said impression identity is accessed from any one of:
- a memory in said printer, said memory storing a plurality of impression identities; and
- a computer system communicating with said printer.

Optionally, said printer is contained in a mobile phone or personal digital assistant.

In a sixth aspect the present invention provides a method of swipe-scanning a graphic image pre-printed on a surface, said method comprising the steps of:
(i) operatively positioning a swipe scanner relative to the surface and swiping the scanner across the surface;
(ii) capturing, during said swipe, successive images of portions of the graphic image;
(iii) printing, during said swipe, successive parts of a position-coding pattern onto the surface, said position-coding pattern being superimposed with said graphic image;
(iv) imaging, during said swipe, portions of said surface on which said printhead has printed said parts of the position-coding pattern;
(v) determining absolute positions of the scanner using the imaged parts of the position-coding pattern; and
(vi) using the absolute positions to assemble said captured portions of said graphic image into a scanned graphic image.

Optionally, an initial position of said swipe scanner provides a reference point for said position-coding pattern.

Optionally, said reference point is an origin.

Optionally, said origin is based on an assumed initial swipe direction in step (i).

Optionally, said origin is a top-left corner of the position-coding pattern, and said initial swipe direction is a left-to-right swipe or a top-to-down swipe.

Optionally, step (i) further comprises the sub-steps of:
- imaging part of a position-coding pattern printed during a previous swipe of the scanner; and
- determining an absolute position of the scanner,
wherein said imaged part of the position-coding pattern is contained in an outer perimeter of the position-coding pattern printed during the previous swipe.

Optionally, said swiping comprises swiping outwardly from said outer perimeter of said pre-printed position-coding pattern.

Optionally, said graphic image is printed with at least one first ink and said position-coding pattern is printed with a second ink.

Optionally, said second ink is an infrared-absorbing ink.

Optionally, the or each first ink has an infrared window enabling imaging of said position-coding pattern in the presence of the first ink.

Optionally, said scanner is configured for unidirectional swiping.

Optionally, said scanner comprises a first image sensor for imaging said position-coding pattern, said first image sensor being positioned downstream of a printhead, wherein a swipe direction is defined as upstream.

Optionally, the method further comprising the steps of:
- sensing relative motion of the scanner during the swipe to generate relative motion data; and
- using the relative motion data together with said absolute positions to assemble said scanned graphic image.

Optionally, the method further comprising the steps of:
- sensing an orientation of the scanner relative to the position-coding pattern;
- using the orientation together with said absolute positions to assemble said scanned graphic image.

Optionally, the method further comprising the steps of:
- accessing an impression identity for said graphic image;
- associating said impression identity with said graphic image;
- generating association data indicating an association between the impression identity, the absolute positions and the graphic image; and
- communicating said association data to a computer system.

Optionally, the printed position-coding pattern further identifies said impression identity.

Optionally, said association data enables said computer system to associate one or more zones of the graphic image with a corresponding interactive element.

Optionally, said interactive element is selected from the group comprising: a hyperlink, an input field and a button.

Optionally, said impression identity is accessed from any one of:
- a memory in said scanner, said memory storing a plurality of impression identities; and
- a computer system communicating with said scanner.

Optionally, said scanner is contained in a mobile phone or personal digital assistant.

In a seventh aspect the present invention provides a method of swipe-scanning a graphic image pre-printed on a surface, said method comprising the steps of:
(i) operatively positioning a swipe-scanner relative to the surface and swiping the scanner across the surface;
(ii) capturing, during said swipe, successive images of portions of the graphic image;

(iii) printing, during said swipe, successive parts of a position-coding pattern onto said graphic image, said position-coding pattern identifying a plurality of absolute positions and an impression identity for the graphic image;

(iv) sensing, during said swipe, positions of said scanner;

(v) using the sensed positions to control, during said swipe, printing of the position-coding pattern;

(vi) using the sensed positions to assemble said captured portions of said graphic image into a scanned graphic image; and (vii) generating association data indicating an association between the impression identity, the plurality of absolute positions and the scanned graphic image.

Optionally, said positions of said scanner are sensed using a first image sensor positioned for imaging portions of said surface on which said printhead has printed during a swipe of the surface, each imaged portion containing part of the position-coding pattern printed by said printhead during said swipe.

Optionally, said first image sensor is positioned downstream of said printhead, wherein a swipe direction is defined as upstream.

Optionally, said positions of said scanner are sensed using a relative motion sensor.

Optionally, said positions of said scanner are sensed using an optical mouse sensor.

Optionally, an initial position of said swipe scanner provides a reference point for said position-coding pattern.

Optionally, said reference point is an origin.

Optionally, said origin is based on an assumed initial swipe direction in step (i).

Optionally, said origin is a top-left corner of the position-coding pattern, and said initial swipe direction is a left-to-right swipe or a top-to-down swipe.

Optionally, step (i) further comprises the sub-steps of:
imaging part of a position-coding pattern printed during a previous swipe of the scanner; and
determining an absolute position of the scanner, wherein said imaged part of the position-coding pattern is contained in an outer perimeter of the position-coding pattern printed during the previous swipe.

Optionally, said swiping comprises swiping outwardly from said outer perimeter of said pre-printed position-coding pattern.

Optionally, the method further comprising the steps of:
sensing an orientation of the scanner relative to the position-coding pattern;
using the orientation together with said absolute positions to assemble said scanned graphic image.

Optionally, said impression identity is accessed from any one of:
a memory in said scanner, said memory storing a plurality of impression identities; and
a computer system communicating with said scanner.

Optionally, said images of the graphic image are captured using a second image sensor positioned parallel and/or substantially coextensive with a printhead.

Optionally, the method further comprising the step of communicating the association data to a computer system, the computer system being configured to confer interactivity on at least part of the pre-printed graphic image using the association data.

Optionally, said association data enables said computer system to associate one or more zones of the graphic image with a corresponding interactive element.

Optionally, said interactive element is a hyperlink and said computer system is configured to:
receive the association data from the scanner;
perform Optical Character Recognition (OCR) on the scanned graphic image to convert text images into computer text;
identify a URI text string in the computer text;
generate an input description for said scanned graphic image, said input description describing the URI and a zone of the URI text string in the scanned graphic image; and
store a page description comprising said input description and said scanned graphic image, said page description being indexed with said impression identity.

Optionally, the method further comprising the steps of:
interacting with a pre-printed URI text string on the surface using an optically imaging sensing device;
reading at least part of the position-coding pattern;
generating interaction data identifying the impression identity and a position of the sensing device;
communicating the interaction data to the computer system; and
receiving a resource corresponding to the hyperlink.

Optionally, said computer system is configured to:
receive the association data from the scanner;
perform Optical Character Recognition (OCR) on the scanned graphic image to convert text images into computer text;
generate an input description for said scanned graphic image, said input description describing words of computer text and zones of corresponding text images in the scanned graphic image; and
store a page description comprising said input description and said scanned graphic image, said page description being indexed with said impression identity.

Optionally, the method further comprising the steps of:
interacting with a printed portion of text on the surface using an optically imaging sensing device;
reading at least part of the position-coding pattern;
generating interaction data identifying the impression identity and a position of the sensing device;
communicating the interaction data to the computer system; and
at least one of:
receiving search results relating to said portion of text; and
copying computer text corresponding to said portion of text to a clipboard.

In an eighth aspect the present invention provides a method of swipe-scanning a graphic image printed on a surface, said surface having a position-coding pattern superimposed with the graphic image, said method comprising the steps of:

(i) operatively positioning a swipe scanner relative to the surface;

(ii) swiping the scanner across the surface;

(iii) capturing, during said swipe, successive images of portions of the graphic image;

(iv) imaging, during said swipe, successive parts of the position-coding pattern;

(v) determining absolute positions of the scanner using the imaged parts of the position-coding pattern; and (vi) using the absolute positions to assemble said captured portions of said graphic image into a scanned graphic image.

Optionally, said positions of said scanner are sensed using a first image sensor.

Optionally, the method further comprising the step of:
  sensing relative motion of the scanner using a motion sensor.

Optionally, the method further comprising the step of:
  using said sensed relative motion together with said absolute positions to assemble said scanned graphic image.

Optionally, said motion sensor is an optical mouse sensor.

Optionally, said optical mouse sensor utilizes said first image sensor.

Optionally, said images of the graphic image are captured using a second image sensor.

Optionally, the method where the second image sensor is a linear image sensor.

Optionally, said second image sensor extends substantially a width of said scanner.

Optionally, said position-coding pattern is printed with an infrared-absorbing ink.

Optionally, the graphic image is printed with one or more inks having an infrared window enabling imaging of said position-coding pattern in the presence of said one or more inks.

Optionally, the method further comprising the steps of:
  sensing an orientation of the scanner relative to the position-coding pattern;
  using the orientation together with said absolute positions to assemble said scanned graphic image.

Optionally, the method further comprising the step of:
  communicating the scanned graphic image to a computer system.

In a ninth aspect the present invention provides a method of conferring interactivity on a pre-printed graphic image containing a URI text string, said graphic image having been scanned and had a position-coding pattern printed thereon, said position-coding pattern identifying a plurality of absolute positions and an impression identity for the graphic image, said method comprising the steps of:
  (i) receiving, in a computer system, association data indicating an association between the impression identity, the plurality of absolute positions and a scanned graphic image;
  (ii) performing Optical Character Recognition (OCR) on the scanned graphic image to convert text images into computer text;
  (iii) identifying a URI text string in the computer text;
  (iv) generating an input description for said scanned graphic image, said input description describing a URI corresponding to said URI text string and a zone of the URI text string in the scanned graphic image; and
  (v) storing a page description comprising said input description and said scanned graphic image, said page description being indexed with said impression identity, wherein said page description is retrievable so as to confer interactivity on the graphic image.

Optionally, the zone of the URI text string is explicitly described with reference to coordinate positions.

Optionally, the zone of the URI text string is inferred from one or more of: a length of the URI text string, a point size of the computer text containing the URI text string, and a position of the URI text string in the computer text.

Optionally, the method further comprising the steps of:
  (vi) receiving interaction data from an optically imaging sensing device interacting with the URI text string contained in the pre-printed graphic image, said interaction data identifying the impression identity and a position of the sensing device;
  (vii) retrieving the page description using the impression identity; and
  (viii) identifying the URI using the position of the sensing device and the retrieved page description.

Optionally, the method further comprising the steps of:
  retrieving a resource corresponding to the identified URI; and
  sending the resource to a user's display device.

Optionally, the method further comprising the step of:
  sending the URI to a user's web browser.

Optionally, said pre-printed graphic image is scanned using a swipe-scanner, said swipe-scanner comprising a printhead for printing said position-coding pattern during scanning of said pre-printed graphic image.

In another aspect the present invention provides a method of conferring interactivity on a pre-printed graphic image containing a URI text string, said graphic image having been scanned and had a position-coding pattern printed thereon, said position-coding pattern identifying a plurality of absolute positions and an impression identity for the graphic image, said method comprising the steps of:
  (i) receiving, in a computer system, association data indicating an association between the impression identity, the plurality of absolute positions and a scanned graphic image;
  (ii) receiving interaction data from an optically imaging sensing device interacting with the URI text string contained in the pre-printed graphic image, said interaction data identifying the impression identity and a position of the sensing device;
  (iii) performing Optical Character Recognition (OCR) on at least a portion of the scanned graphic image to convert text images into computer text;
  (iv) identifying the URI text string in the computer text; and
  (v) identifying the URI from the URI text string.

Optionally, the portion of the scanned graphic image is a word, sentence or paragraph containing the position of the sensing device.

In a further aspect the present invention provides a method of conferring interactivity on a pre-printed graphic image containing a URI text string, said graphic image having been scanned and had a position-coding pattern printed thereon, said position-coding pattern identifying a plurality of absolute positions and an impression identity for the graphic image, said method comprising the steps of:
  (i) receiving, in a computer system, association data indicating an association between the impression identity, the plurality of absolute positions and a scanned graphic image;
  (ii) performing Optical Character Recognition (OCR) on the scanned graphic image to convert text images into computer text;
  (iii) generating an input description for said scanned graphic image, said input description describing words of computer text and zones of corresponding text images in the scanned graphic image;
  (iv) storing a page description comprising said input description and said scanned graphic image, said page description being indexed with said impression identity,
  (v) receiving interaction data from an optically imaging sensing device interacting with the URI text string contained in the pre-printed graphic image, said interaction data identifying the impression identity and a position of the sensing device;
  (vi) retrieving the page description using the impression identity;
  (iv) identifying the URI text string in the computer text; and
  (v) identifying the URI from the URI text string.

In a further aspect the present invention provides a system for conferring interactivity on a pre-printed graphic image containing a URI text string, said graphic image having been scanned and had a position-coding pattern printed thereon, said position-coding pattern identifying a plurality of absolute positions and an impression identity for the graphic image, said system comprises a computer system configured for:
- (i) receiving association data indicating an association between the impression identity, the plurality of absolute positions and a scanned graphic image;
- (ii) performing Optical Character Recognition (OCR) on the scanned graphic image to convert text images into computer text;
- (iii) identifying a URI text string in the computer text;
- (iv) generating an input description for said scanned graphic image, said input description describing a URI corresponding to the URI text string and a zone of the URI text string in the scanned graphic image; and
- (v) storing a page description comprising said input description and said scanned graphic image, said page description being indexed with said impression identity, wherein said page description is retrievable so as to confer interactivity on the graphic image.

Optionally, the system further comprising a scanner for scanning the pre-printed graphic image.

Optionally, said scanner comprises a printhead for printing the position-coding pattern.

Optionally, said scanner comprises a processor for generating the association data.

Optionally, the system further comprising an optically imaging sensing device configured for:
  interacting with the pre-printed graphic image;
  reading at least part of the position-coding pattern;
  generating interaction data identifying the impression identity and a position of the sensing device; and
  communicating the interaction data to the computer system.

Optionally, said computer system is further configured for:
- (vi) receiving interaction data from an optically imaging sensing device interacting with the URI text string contained in the pre-printed graphic image, said interaction data identifying the impression identity and a position of the sensing device;
- (vii) retrieving the page description using the impression identity; and
- (viii) identifying the URI using the position of the sensing device and the retrieved page description.

Optionally, said computer system is further configured for:
  retrieving a resource corresponding to the identified URI; and
  sending the resource to a user's display device.

Optionally, said computer system is further configured for:
  sending the URI to a web browser running on a user's display device.

In another aspect the present invention provides a system for conferring interactivity on a pre-printed graphic image containing a URI text string, said graphic image having been scanned and had a position-coding pattern printed thereon, said position-coding pattern identifying a plurality of absolute positions and an impression identity for the graphic image, said system comprises a computer system configured for:
- (i) receiving association data indicating an association between the impression identity, the plurality of absolute positions and a scanned graphic image;
- (ii) receiving interaction data from an optically imaging sensing device interacting with the URI text string contained in the pre-printed graphic image, said interaction data identifying the impression identity and a position of the sensing device;
- (iii) performing Optical Character Recognition (OCR) on at least a portion of the scanned graphic image to convert text images into computer text;
- (iv) identifying a URI text string in the computer text; and
- (v) identifying the URI from the URI text string.

Optionally, the portion of the scanned graphic image is a word, sentence or paragraph containing the position of the sensing device.

In a tenth aspect the present invention provides a method of conferring interactivity on a pre-printed graphic image containing text, said graphic image having been scanned and had a position-coding pattern printed thereon, said position-coding pattern identifying a plurality of absolute positions and an impression identity for the graphic image, said method comprising the steps of:
- (i) receiving, in a computer system, association data indicating an association between the impression identity, the plurality of absolute positions and a scanned graphic image;
- (ii) performing Optical Character Recognition (OCR) on the scanned graphic image to convert text images into computer text;
- (iii) generating an input description for said scanned graphic image, said input description describing words of computer text and zones of corresponding text images in the scanned graphic image; and
- (iv) storing a page description comprising said input description and said scanned graphic image, said page description being indexed with said impression identity, wherein said page description is retrievable so as to confer interactivity on the graphic image.

Optionally, the zone of the text image is explicitly described with reference to coordinate positions.

Optionally, the zones of text images are inferred, using the computer text, from one or more of: lengths of words, point size, and positions of the words in the computer text.

Optionally, the method further comprising the steps of:
- (v) receiving interaction data from an optically imaging sensing device interacting with a portion of text contained in the pre-printed graphic image, said interaction data identifying the impression identity and a position of the sensing device; and
- (vi) retrieving the page description using the impression identity.

Optionally, the method further comprising the step of:
  identifying a search query using said retrieved page description and the position of the sensing device, said search query including one or more keywords contained in said portion of text;
  generating a request URI using said search query; and
  sending the request URI, or search results obtained using the request URI, to a user.

Optionally, the method further comprising the step of:
  identifying computer text corresponding to said portion of text using the page description and the position of the sensing device; and
  copying the identified computer text to a clipboard.

Optionally, the method further comprising the step of:
  pasting contents of the clipboard to an application.

In another aspect the present invention provides a method of conferring interactivity on a pre-printed graphic image containing text, said graphic image having been scanned and had a position-coding pattern printed thereon, said position-coding pattern identifying a plurality of absolute positions and an impression identity for the graphic image, said method comprising the steps of:
- (i) receiving, in a computer system, association data indicating an association between the impression identity, the plurality of absolute positions and a scanned graphic image;
- (ii) receiving interaction data from an optically imaging sensing device interacting with a portion of text contained in the pre-printed graphic image, said interaction data identifying the impression identity and a position of the sensing device;
- (iii) performing Optical Character Recognition (OCR) on at least a portion of the scanned graphic image to convert text images into computer text; and
- (iv) identifying one or more words of computer text contained in the portion of the scanned graphic image.

Optionally, the portion of the scanned graphic image is a word, sentence or paragraph containing the position of the sensing device.

Optionally, said one or more words of computer text are used to initiate at least one of: a search, copying to a clipboard, and pasting to an application.

In a further aspect the present invention provides a system for conferring interactivity on a pre-printed graphic image containing text, said graphic image having been scanned and had a position-coding pattern printed thereon, said position-coding pattern identifying a plurality of absolute positions and an impression identity for the graphic image, said system comprising a computer system configured for:
- (i) receiving association data indicating an association between the impression identity, the plurality of absolute positions and a scanned graphic image;
- (ii) performing Optical Character Recognition (OCR) on the scanned graphic image to convert text images into computer text;
- (iii) generating an input description for said scanned graphic image, said input description describing words of computer text and zones of corresponding text images in the scanned graphic image; and
- (iv) storing a page description comprising said input description and said scanned graphic image, said page description being indexed with said impression identity, wherein said page description is retrievable so as to confer interactivity on the graphic image.

Optionally, the system further comprising a scanner for scanning the pre-printed graphic image.

Optionally, said scanner comprises a printhead for printing the position-coding pattern and a processor for generating the association data.

Optionally, the system further comprising an optically imaging sensing device configured for:
- interacting with the pre-printed graphic image;
- reading at least part of the position-coding pattern;
- generating interaction data identifying the impression identity and a position of the sensing device; and
- communicating the interaction data to the computer system.

Optionally, said computer system is further configured for:
- (v) receiving interaction data from an optically imaging sensing device interacting with a portion of text contained in the pre-printed graphic image, said interaction data identifying the impression identity and a position of the sensing device; and
- (vi) retrieving the page description using the impression identity.

Optionally, said computer system is further configured for:
- identifying a search query using said retrieved page description and the position of the sensing device, said search query including one or more keywords contained in said portion of text;
- generating a request URI using said search query; and
- sending the request URI, or search results obtained using the request URI, to a user.

Optionally, said computer system is further configured for:
- identifying computer text corresponding to said portion of text using the page description and the position of the sensing device; and
- copying the identified computer text to a clipboard.

In a further aspect the present invention provides a system for conferring interactivity on a pre-printed graphic image containing text, said graphic image having been scanned and had a position-coding pattern printed thereon, said position-coding pattern identifying a plurality of absolute positions and an impression identity for the graphic image, said system comprising a computer system configured for:
- (i) receiving association data indicating an association between the impression identity, the plurality of absolute positions and a scanned graphic image;
- (ii) receiving interaction data from an optically imaging sensing device interacting with a portion of text contained in the pre-printed graphic image, said interaction data identifying the impression identity and a position of the sensing device;
- (iii) performing Optical Character Recognition (OCR) on at least a portion of the scanned graphic image to convert text images into computer text; and
- (iv) identifying one or more words of computer text contained in the portion of the scanned graphic image.

Optionally, the portion of the scanned graphic image is a word, sentence or paragraph containing the position of the sensing device.

Optionally, said computer system is configured to use said one or more words of computer text to initiate at least one of: a search, copying to a clipboard, and pasting to an application.

In an eleventh aspect the present invention provides a flatbed scanner comprising:
- a platen for supporting a substrate, said substrate having a surface bearing a pre-printed graphic image;
- a carriage for traversing across the surface, said carriage comprising:
  - a pagewidth scanhead for scanning the pre-printed graphic image during a traverse of the surface; and
  - a pagewidth printhead for printing a position-coding pattern onto said surface during said traverse, said position-coding pattern identifying an impression identity and a plurality of positions;
- an ink supply containing an ink for printing the position-coding pattern; and
- a processor configured for generating association data, said association data indicating an association between a scanned graphic image, the impression identity and the plurality of positions.

Optionally, said ink is an infrared-absorbing ink.

Optionally, the flatbed further comprising a memory for storing a plurality of impression identities, each stored impression identity being associable with the scanned graphic image.

Optionally, said ink supply comprises said memory.

Optionally, the flatbed scanner further comprising communication means for communicating with a computer system.

Optionally, said association data enables said computer system to associate one or more zones of the scanned graphic image with a corresponding interactive element.

Optionally, said interactive element is selected from the group comprising: a hyperlink, an input field and a button.

Optionally, said computer system is configured for:
(i) performing Optical Character Recognition (OCR) on the scanned graphic image to convert text images into computer text;
(ii) generating an input description for said scanned graphic image, said input description describing words of computer text and zones of corresponding text images in the scanned graphic image; and
(iii) storing a page description comprising said input description and said scanned graphic image, said page description being indexed with said impression identity, wherein said page description is retrievable so as to confer interactivity on the graphic image.

Optionally, said computer system is further configured for:
identifying a URI text string in the computer text; and
generating the input description further describing a URI corresponding to said URI text string and a zone of the corresponding URI text string in the scanned graphic image.

Optionally, said carriage further comprises an image sensor positioned and configured for imaging portions of the position-coding pattern printed on said surface during said traverse.

Optionally, said image sensor is positioned downstream of said printhead, wherein a direction of said traverse is defined as upstream.

Optionally, is configurable in at least one mode selected from:
a conventional scanning mode in which said scanhead scans and said printhead does not print the position-coding pattern; and
an interactive scanning mode in which said scanhead scans and said printhead prints the position-coding pattern.

In another aspect the present invention provides a system for conferring interactivity on a pre-printed graphic image, said system comprising:
(A) a flatbed scanner comprising:
a platen for supporting a substrate, said substrate having a surface bearing a pre-printed graphic image;
a carriage for traversing across the surface, said carriage comprising:
a pagewidth scanhead for scanning the pre-printed graphic image during a traverse of the surface; and
a pagewidth printhead for printing a position-coding pattern onto said surface during said traverse, said position-coding pattern identifying an impression identity and a plurality of positions;
an ink supply containing an ink for printing the position-coding pattern;
a processor configured for generating association data indicating an association between a scanned graphic image, the impression identity and the plurality of positions; and
communication means for communication the association data to a computer system; and
(B) the computer system configured for:
receiving the association data; and
storing a page description for said scanned graphic image, said page description being indexed with said impression identity
wherein said page description is retrievable so as to confer interactivity on the graphic image.

Optionally, said computer system is configured for:
(i) performing Optical Character Recognition (OCR) on the scanned graphic image to convert text images into computer text;
(ii) generating an input description for said scanned graphic image, said input description describing words of computer text and zones of corresponding text images in the scanned graphic image; and
(iii) storing the page description comprising said input description and said scanned graphic image, said page description being indexed with said impression identity, wherein said page description is retrievable so as to confer interactivity on the graphic image.

Optionally, said computer system is further configured for:
identifying a URI text string in the computer text; and
generating the input description further describing a URI corresponding to said URI text string and a zone of the corresponding URI text string in the scanned graphic image.

In a twelfth aspect the present invention provides a printer comprising:
a feed mechanism for feeding a substrate past a printhead assembly, said substrate having a surface bearing a pre-printed graphic image;
a printhead assembly comprising:
a printhead for printing a position-coding pattern onto said surface, said position-coding pattern identifying an impression identity and a plurality of positions; and
a scanhead for scanning the pre-printed graphic image;
an ink supply containing an ink for printing the position-coding pattern; and
a processor configured for generating association data, said association data indicating an association between a scanned graphic image, the impression identity and the plurality of positions.

Optionally, said printhead is a stationary pagewidth printhead.

Optionally, said scanhead is a stationary pagewidth scanhead.

Optionally, said ink is an infrared-absorbing ink.

Optionally, the printer further comprising a memory for storing a plurality of impression identities, each stored impression identity being associable with a scanned graphic image.

Optionally, said ink supply comprises said memory.

Optionally, the printer further comprising communication means for communicating with a computer system.

Optionally, said association data enables said computer system to associate one or more zones of the scanned graphic image with a corresponding interactive element.

Optionally, said interactive element is selected from the group comprising: a hyperlink, an input field and a button.

Optionally, said computer system is configured for:
(i) performing Optical Character Recognition (OCR) on the scanned graphic image to convert text images into computer text;
(ii) generating an input description for said scanned graphic image, said input description describing words of computer text and zones of corresponding text images in the scanned graphic image; and
(iii) storing a page description comprising said input description and said scanned graphic image, said page description being indexed with said impression identity, wherein said page description is retrievable so as to confer interactivity on the graphic image.

Optionally, said computer system is further configured for:
identifying a URI text string in the computer text; and
generating the input description further describing a URI corresponding to said URI text string and a zone of the corresponding URI text string in the scanned graphic image.

Optionally, said printhead assembly further comprises an image sensor positioned and configured for imaging portions of the position-coding pattern printed on said surface.

Optionally, said image sensor is positioned downstream of said printhead, wherein a direction of feeding said substrate is defined as downstream.

Optionally, the printhead is configured for printing colored graphic images in addition to said position-coding pattern, and wherein said ink supply comprises colored inks.

Optionally, is configurable in at least one mode selected from:
- a conventional scanning mode in which said scanhead scans and said printhead does not print;
- an interactive scanning mode in which said scanhead scans, said printhead prints the position-coding pattern and said processor generates the association data;
- a conventional printing mode in which said printhead prints colored graphic images and said scanhead does not scan; and
- an interactive printing mode in which said printhead prints colored graphic images together with the position-coding pattern and said scanhead does not scan.

In another aspect the present invention provides a system for conferring interactivity on a pre-printed graphic image, said system comprising:

(A) a printer comprising:
a feed mechanism for feeding a substrate past a printhead assembly, said substrate having a surface bearing a pre-printed graphic image;
a printhead assembly comprising:
  a printhead for printing a position-coding pattern onto said surface, said position-coding pattern identifying an impression identity and a plurality of positions;
  a scanhead for scanning the pre-printed graphic image;
  an ink supply containing an ink for printing the position-coding pattern;
a processor configured for generating association data, said association data indicating an association between a scanned graphic image, the impression identity and the plurality of positions; and
communication means for communication the association data to a computer system; and
(B) the computer system configured for:
receiving the association data; and
storing a page description for said scanned graphic image, said page description being indexed with said impression identity
wherein said page description is retrievable so as to confer interactivity on the graphic image.

Optionally, said computer system is configured for:
(i) performing Optical Character Recognition (OCR) on the scanned graphic image to convert text images into computer text;
(ii) generating an input description for said scanned graphic image, said input description describing words of computer text and zones of corresponding text images in the scanned graphic image; and
(iii) storing the page description comprising said input description and said scanned graphic image, said page description being indexed with said impression identity,
wherein said page description is retrievable so as to confer interactivity on the graphic image.

Optionally, said computer system is further configured for:
identifying a URI text string in the computer text; and
generating the input description further describing a URI corresponding to said URI text string and a zone of the corresponding URI text string in the scanned graphic image.

In a thirteenth aspect the present invention provides a method of conferring interactivity on a pre-printed graphic image, said method comprising the steps of:
(i) providing a substrate having a surface bearing the pre-printed graphic image and an imposed position-coding pattern, said position-coding pattern identifying an impression identity and a plurality of absolute positions;
(ii) scanning said surface with a scanhead, said scanning capturing successive images of portions of the graphic image;
(iii) imaging, during said scan, at least one part of the position-coding pattern using an optical sensor;
(iv) determining at least one absolute position using the imaged part of the position-coding pattern;
(v) determining the impression identity using the imaged part of the position-coding pattern;
(vi) assembling said captured portions of said graphic image into a scanned graphic image;
(vii) generating association data indicating an association between the scanned graphic image, the impression identity and a plurality of absolute positions; and
(viii) communicating the association data to a computer system, thereby enabling the computer system to confer interactivity on the graphic image.

Optionally, said position-coding pattern is printed on said surface subsequently to said pre-printed graphic image.

Optionally, said position-coding pattern is disposed on an adhesive transparency attached to said surface.

Optionally, said scanned image is assembled using at least one of: absolute positions of the scanhead determined from: a plurality of imaged parts of the position-coding pattern and a known distance between the scanhead and the optical sensor;
a known speed of the scanhead relative to the surface;
a known speed of the surface relative to the scanhead.

Optionally, said scanhead is a moving scanhead and said surface is stationary.

Optionally, said scanhead is stationary and said substrate is fed past the scanhead.

Optionally, said association data enables said computer system to associate one or more zones of the scanned graphic image with a corresponding interactive element.

Optionally, said interactive element is selected from the group comprising: a hyperlink, an input field and a button.

Optionally, the method further comprising the steps of:
performing Optical Character Recognition (OCR) on the scanned graphic image to convert text images into computer text;
generating an input description for said scanned graphic image, said input description describing words of computer text and zones of corresponding text images in the scanned graphic image; and
storing a page description comprising said input description and said scanned graphic image, said page description being indexed with said impression identity,
wherein said page description is retrievable so as to confer interactivity on the graphic image.

Optionally, the method further comprising the steps of:

identifying a URI text string in the computer text; and generating the input description further describing a URI corresponding to the URI text string and a zone of the corresponding URI text string in the scanned graphic image.

Optionally, in step (i), said impression identity is unassociated with said graphic image.

In a further aspect the present invention provides a method of conferring interactivity on a pre-printed graphic image, said method comprising the steps of:

(i) imposing a position-coding pattern onto a surface bearing the pre-printed graphic image, said position-coding pattern identifying an impression identity and a plurality of absolute positions;

(ii) scanning said surface with a scanhead, said scanning capturing successive images of portions of the graphic image;

(iii) imaging, during said scan, at least one part of the position-coding pattern using an optical sensor;

(iv) determining at least one absolute position using the imaged part of the position-coding pattern;

(v) determining the impression identity using the imaged part of the position-coding pattern;

(vi) assembling said captured portions of said graphic image into a scanned graphic image;

(vii) generating association data indicating an association between the scanned graphic image, the impression identity and the plurality of absolute positions; and (viii) communicating the association data to a computer system, thereby enabling the computer system to confer interactivity on the graphic image.

Optionally, said position-coding pattern is imposed by means of printing the pattern onto the surface.

Optionally, said position-coding pattern is imposed by means of attaching an adhesive transparency to the surface, said transparency comprising the position-coding pattern.

In a further aspect the present invention provides a system for conferring interactivity on a pre-printed graphic image, said system comprising:

(A) a substrate having a surface bearing the pre-printed graphic image and an imposed position-coding pattern, said position-coding pattern identifying an impression identity and a plurality of absolute positions;

(B) a scanner comprising:

(a) a scanhead for capturing successive images of portions of the graphic image;

(b) an optical sensor for imaging, during said scan, at least one part of the position-coding pattern;

(c) a processor configured for:

determining at least one absolute position using the imaged part of the position-coding pattern;

determining the impression identity using the imaged part of the position-coding pattern;

assembling said captured portions of said graphic image into a scanned graphic image; and generating association data indicating an association between the scanned graphic image, the impression identity and the plurality of absolute positions; and (d) communication means for communicating the association data to a computer system, thereby enabling the computer system to confer interactivity on the graphic image.

Optionally, the system further comprising:

(C) the computer system configured for:

receiving the association data; and storing a page description for said scanned graphic image, said page description being indexed with said impression identity, wherein said page description is retrievable so as to confer interactivity on the graphic image.

Optionally, said computer system is configured for:

(i) performing Optical Character Recognition (OCR) on the scanned graphic image to convert text images into computer text;

(ii) generating an input description for said scanned graphic image, said input description describing words of computer text and zones of corresponding text images in the scanned graphic image; and (iii) storing the page description comprising said input description and said scanned graphic image, said page description being indexed with said impression identity, wherein said page description is retrievable so as to confer interactivity on the graphic image.

Optionally, said computer system is further configured for:

identifying a URI text string in the computer text; and generating the input description further describing a URI corresponding to said URI text string and a zone of the corresponding URI text string in the scanned graphic image.

Optionally, said impression identity is initially unassociated with the graphic image in the substrate (A).

BRIEF DESCRIPTION OF DRAWINGS

Preferred and other embodiments of the invention will now be described, by way of non-limiting example only, with reference to the accompanying drawings, in which.

DETAILED DESCRIPTION OF PREFERRED AND OTHER EMBODIMENTS

1 Netpage System Overview 1.1 Netpage System Architecture

The present invention is used in connection with the Applicant's netpage system, which has been described in detail in the cross-referenced patent applications identified above.

In brief summary, the preferred form of the netpage system employs a computer interface in the form of a mapped surface, that is, a physical surface which contains references to a map of the surface maintained in a computer system. The map references can be queried by an appropriate sensing device.

Depending upon the specific implementation, the map references may be encoded visibly or invisibly, and defined in such a way that a local query on the mapped surface yields an unambiguous map reference both within the map and among different maps. The computer system can contain information about features on the mapped surface, and such information can be retrieved based on map references supplied by a sensing device used with the mapped surface. The information thus retrieved can take the form of actions which are initiated by the computer system on behalf of the operator in response to the operator's interaction with the surface features.

In its preferred form, the netpage system relies on the production of, and human interaction with, netpages. These are pages of text, graphics and images printed on ordinary paper, but which work like interactive webpages. Information is encoded on each page using ink which is substantially invisible to the unaided human eye. The ink, however, and thereby the coded data, can be sensed by an optically imaging sensing device ("reader") and transmitted to the netpage system. The sensing device may take the form of, for example, a clicker (for clicking on a specific position on a surface), a pointer having a stylus (for pointing or gesturing on a surface using pointer strokes), or a pen having a marking nib (for marking a surface with ink when pointing, gesturing or writing on the surface). Any references herein to "pen" or "netpage pen" are provided by way of example only. It will, of course, be appreciated that the netpage pen may take the form of any suitable optically imaging sensing device or reader.

In one embodiment, active buttons and hyperlinks on each page can be clicked with the sensing device to request information from the network or to signal preferences to a network server. In one embodiment, text written by hand on a netpage is automatically recognized and converted to computer text in the netpage system, allowing forms to be filled in. In other embodiments, signatures recorded on a netpage are automatically verified, allowing e-commerce transactions to be securely authorized. In other embodiments, text on a netpage may be clicked or gestured to initiate a search based on keywords indicated by the user.

Figure 1:
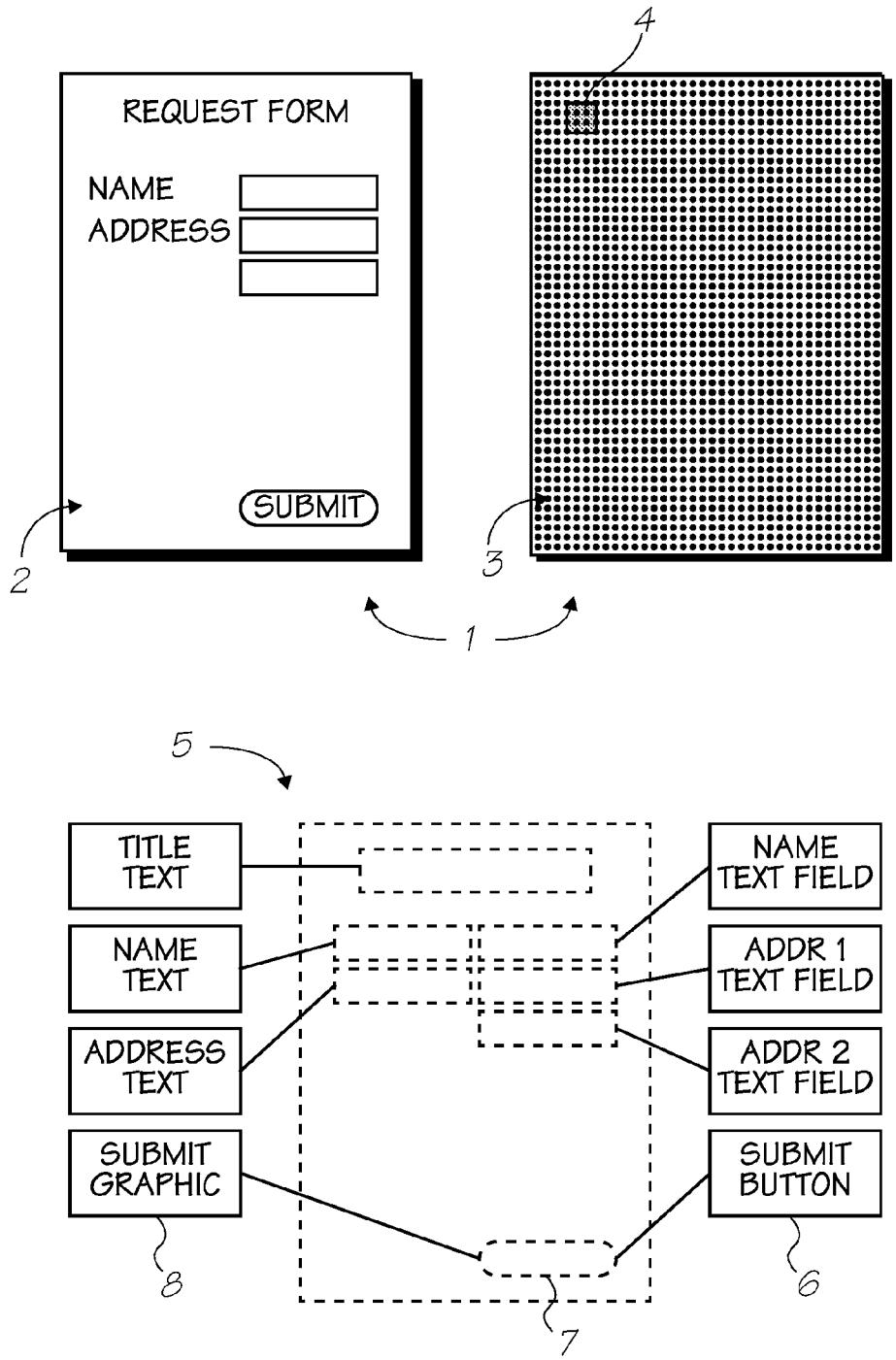
FIG. 1 is a schematic of a the relationship between a sample printed netpage and its online page description.

As illustrated in FIG. 1, a printed netpage 1 can represent an interactive form which can be filled in by the user both physically, on the printed page, and "electronically", via communication between the pen and the netpage system. The example shows a "Request" form containing name and address fields and a submit button. The netpage 1 consists of a graphic impression 2, printed using visible ink, and a surface coding pattern 3 superimposed with the graphic impression. The coding pattern 3 is typically printed with an infrared ink and the superimposed graphic impression 2 is printed with colored ink(s) having a complementary infrared window, allowing infrared imaging of the coding pattern 3.

The surface coding pattern 3 typically takes the form of a grid of target dots, which comprises a collection of tags 4. One such tag 4 is shown in the shaded region of FIG. 1, although it will be appreciated that contiguous tags 4, defined by the coding pattern 3, are densely tiled over the whole netpage 1.

A corresponding page description 5, stored on the netpage network, describes the individual elements of the netpage. In particular it has an input description describing the type and spatial extent (zone) of each interactive element (i.e. text field or button in the example), to allow the netpage system to correctly interpret input via the netpage. The submit button 6, for example, has a zone 7 which corresponds to the spatial extent of the corresponding graphic 8.

Figure 2:
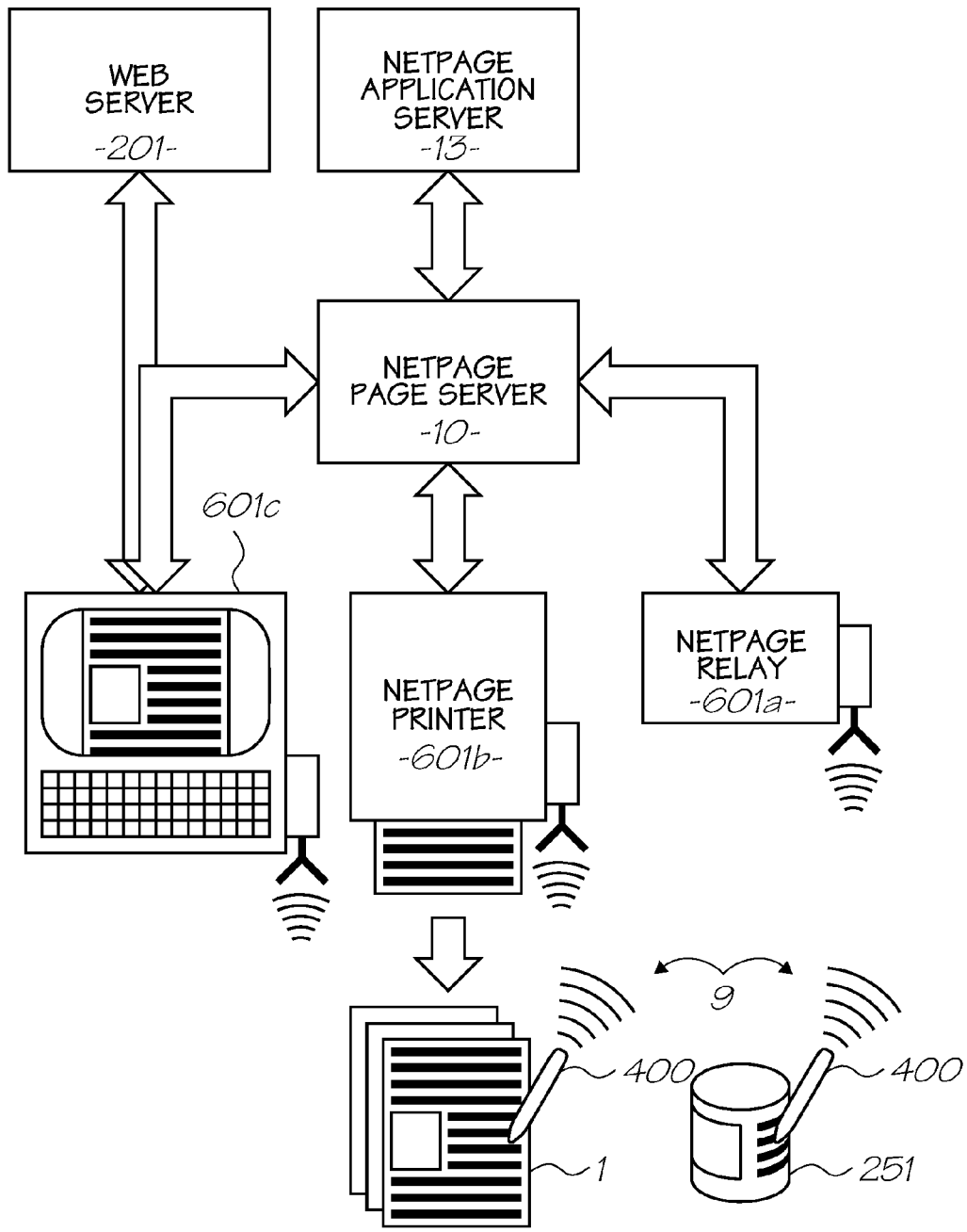
FIG. 2 shows an embodiment of basic netpage architecture with various alternatives for the relay device.

As illustrated in FIG. 2, a netpage reader 400 (e.g. netpage pen) works in conjunction with a netpage relay device 601, which is an Internet-connected device for home, office or mobile use. The reader 400 is wireless and communicates securely with the netpage relay device 601 via a short-range radio link 9. In an alternative embodiment, the reader 400 utilizes a wired connection, such as a USB or other serial connection, to the relay device 601.

The relay device 601 performs the basic function of relaying interaction data to a page server 10, which interprets the interaction data. As shown in FIG. 2, the relay device 601 may, for example, take the form of a personal computer 601a, a netpage printer 601b or some other relay 601c (e.g. personal computer or mobile phone incorporating a web browser).

The netpage printer 601b is able to deliver, periodically or on demand, personalized newspapers, magazines, catalogs, brochures and other publications, all printed at high quality as interactive netpages. Unlike a personal computer, the netpage printer is an appliance which can be, for example, wall-mounted adjacent to an area where the morning news is first consumed, such as in a user's kitchen, near a breakfast table, or near the household's point of departure for the day. It also comes in tabletop, desktop, portable and miniature versions. Netpages printed on-demand at their point of consumption combine the ease-of-use of paper with the timeliness and interactivity of an interactive medium.

Alternatively, the netpage relay device 601 may be a portable device, such as a mobile phone or PDA, a laptop or desktop computer, or an information appliance connected to a shared display, such as a TV. If the relay device 601 is not a netpage printer 601b which prints netpages digitally and on demand, the netpages may be printed by traditional analog printing presses, using such techniques as offset lithography, flexography, screen printing, relief printing and rotogravure, as well as by digital printing presses, using techniques such as drop-on-demand inkjet, continuous inkjet, dye transfer, and laser printing. As will be explained in more detail below, the present invention provides an alternative means which enables users conveniently to generate netpages, as well as scan or print images.

As shown in FIG. 2, the netpage reader 400 interacts with a portion of the position-coding tag pattern on a printed netpage 1, or other printed substrate such as a label of a product item 251, and communicates, via a short-range radio link 9, the interaction to the relay device 601. The relay 601 sends corresponding interaction data to the relevant netpage page server 10 for interpretation. Raw data received from the netpage reader 400 may be relayed directly to the page server 10 as interaction data. Alternatively, the interaction data may be encoded in the form of an interaction URI and transmitted to the page server 10 via a user's web browser 601c. The web browser 601c may then receive a URI from the page server 10 and access a webpage via a webserver 201. In some circumstances, the page server 10 may access application computer software running on a netpage application server 13.

The netpage relay device 601 can be configured to support any number of readers 400, and a reader can work with any number of netpage relays. In the preferred implementation, each netpage reader 400 has a unique identifier. This allows each user to maintain a distinct profile with respect to a netpage page server 10 or application server 13.

A netpage pen may be registered with a netpage registration server 11 and linked to one or more payment card accounts. This allows e-commerce payments to be securely authorized using the netpage pen. The netpage registration server compares the signature captured by the netpage pen with a previously registered signature, allowing it to authenticate the user's identity to an e-commerce server. Other biometrics can also be used to verify identity. One version of the netpage pen includes fingerprint scanning, verified in a similar way by the netpage registration server.

1.2 Netpages

Netpages are the foundation on which a netpage network is built. They provide a paper-based user interface to published information and interactive services.

As shown in FIG. 1, a netpage consists of a printed page (or other surface region) invisibly tagged with references to an online description 5 of the page. The online page description 5 is maintained persistently by the netpage page server 10. The page description has a visual description describing the visible layout and content of the page, including text, graphics and images. It also has an input description describing the input elements on the page, including buttons, hyperlinks, and input fields. A netpage allows markings made with a netpage pen on its surface to be simultaneously captured and processed by the netpage system.

Multiple netpages (for example, those printed by analog printing presses) can share the same page description. However, to allow input through otherwise identical pages to be distinguished, each netpage may be assigned a unique page identifier in the form of a page ID (or, more generally, an impression ID). The page ID has sufficient precision to distinguish between a very large number of netpages.

Each reference to the page description 5 is repeatedly encoded in the netpage pattern. Each tag (and/or a collection of contiguous tags) identifies the unique page on which it appears, and thereby indirectly identifies the page description 5. Each tag also identifies its own position on the page. Characteristics of the tags are described in more detail below.

Tags are typically printed in infrared-absorptive ink on any substrate which is infrared-reflective, such as ordinary paper, or in infrared fluorescing ink. Near-infrared wavelengths are invisible to the human eye but are easily sensed by a solid-state image sensor with an appropriate filter.

A tag is sensed by a 2D area image sensor in the netpage reader 400, and the tag data is transmitted to the netpage system via the nearest netpage relay device 601. The reader 400 is wireless and communicates with the netpage relay device 601 via a short-range radio link. It is important that the reader recognize the page ID and position on every interaction with the page, since the interaction is stateless. Tags are error-correctably encoded to make them partially tolerant to surface damage.

The netpage page server 10 maintains a unique page instance for each unique printed netpage, allowing it to maintain a distinct set of user-supplied values for input fields in the page description 5 for each printed netpage 1.

1.3 Netpage Tags

Each tag 4, contained in the position-coding pattern 3, identifies an absolute location of that tag within a region of a substrate.

Each interaction with a netpage should also provide a region identity together with the tag location. In a preferred embodiment, the region to which a tag refers coincides with an entire page, and the region ID is therefore synonymous with the page ID of the page on which the tag appears. In other embodiments, the region to which a tag refers can be an arbitrary subregion of a page or other surface. For example, it can coincide with the zone of an interactive element, in which case the region ID can directly identify the interactive element.

As described in some of the Applicant's previous applications (e.g. U.S. Pat. No. 6,832,717), the region identity may be encoded discretely in each tag 4. As described other of the Applicant's applications (e.g. US application Ser. Nos. 12/025,746 & 12/025,765 filed on Feb. 5, 2008), the region identity may be encoded by a plurality of contiguous tags in such a way that every interaction with the substrate still identifies the region identity, even if a whole tag is not in the field of view of the sensing device.

Each tag 4 should preferably identify an orientation of the tag relative to the substrate on which the tag is printed. Strictly speaking, each tag 4 identifies an orientation of tag data relative to a grid containing the tag data. However, since the grid is typically oriented in alignment with the substrate, then orientation data read from a tag enables the rotation (yaw) of the netpage reader 400 relative to the grid, and thereby the substrate, to be determined. As explained in Section 3, the netpage reader 400 in the present invention typically takes the form of a swipe printer or swipe scanner.

A tag 4 may also encode one or more flags which relate to the region as a whole or to an individual tag. One or more flag bits may, for example, signal a netpage reader 400 to provide feedback indicative of a function associated with the immediate area of the tag, without the reader having to refer to a corresponding page description 5 for the region. A netpage reader may, for example, illuminate an "active area" LED when positioned in the zone of a hyperlink.

A tag 4 may also encode a digital signature or a fragment thereof. Tags encoding digital signatures (or a part thereof) are useful in applications where it is required to verify a product's authenticity. Such applications are described in, for example, US Publication No. 2007/0108285, the contents of which is herein incorporated by reference. The digital signature may be encoded in such a way that it can be retrieved from every interaction with the substrate. Alternatively, the digital signature may be encoded in such a way that it can be assembled from a random or partial scan of the substrate.

It will, of course, be appreciated that other types of information (e.g. tag size etc) may also be encoded into each tag or a plurality of tags.

For a full description of netpage tags 4, reference is made to the Applicant's previously filed patent applications identified above, the contents of which are herein incorporated by reference.

2. Swipe Printer

A printer built into a hand-held device such as a mobile phone or PDA can be designed to transfer an image onto a surface as the device is swiped manually across the surface (see, for example, U.S. Pat. Nos. 7,140,792 and 7,241,005, the contents of which are herein incorporated by reference).

Swipe printers typically incorporate a wide printhead capable of printing an image several inches wide (e.g. from 1 to 4 inches) without the printhead having to be scanned in the direction perpendicular to the swipe movement.

Typically, swipe printers known in the prior art incorporate one or more motion sensors to allow it to print the image onto a surface with reasonable registration. Such sensors may consist of wheels that engage with the surface and turn during movement, or non-contact sensors such as optical mouse style sensors (see, for example, U.S. Pat. No. 7,241,005).

A major drawback of existing swipe printers is that the motion sensors typically only sense relative motion. This typically precludes the use of multiple swipes to print an image, e.g. an image wider than the printhead. And although multiple motion sensors can be used to improve motion sensing, such as more accurately sensing curved motion, manual swiping typically introduces some deformation into the printed image.

It would be desirable to provide an absolute reference on the surface, to allow both precise registration within a swipe, and precise registration between swipes. The Netpage system provides such a reference, in the form of an infrared position-coding tag pattern 3 on the surface (see, for example, U.S. Pat. No. 6,832,717 and U.S. application Ser. Nos. 12/025,746 & 12/025,765 filed on Feb. 5, 2008, the contents of which are herein incorporated by reference).

The Netpage tag pattern 3 can already exist on the surface, e.g. if it has been previously printed by a Netpage-enabled printer. Alternatively, the swipe printer can print the tag pattern as it proceeds. This latter arrangement has the added advantage that the printed image can be printed onto plain paper and still be interactive in the full Netpage sense, i.e. supporting annotations, fillable form fields, and hyperlinks.

Referring to FIGS. 3 to 6, a Netpage swipe printer 100 incorporates a printhead 110 and at least one Netpage tag sensor 120. The tag sensor 120 is configured so that it can sense tags on a surface when the swipe printer is placed on the surface ready for printing.

The tag sensor 120 senses its absolute location relative to a grid 3 encoded in the tag pattern, as well as its orientation relative to the grid. It also senses the unique identity of the surface, which is also encoded in the tag pattern 3. The tag sensor 120 senses its location and orientation on a regular and frequent basis, e.g. at a rate of 100 Hz or more, and so functions as an absolute motion sensor. This potentially obviates the need for a relative motion sensor, or the need for more than one motion sensor. However, relative motion sensors may still be used in combination with the tag sensor 120 to improve the accuracy of position sensing, or to lower the sampling rate of the tag sensor.

Figure 3:
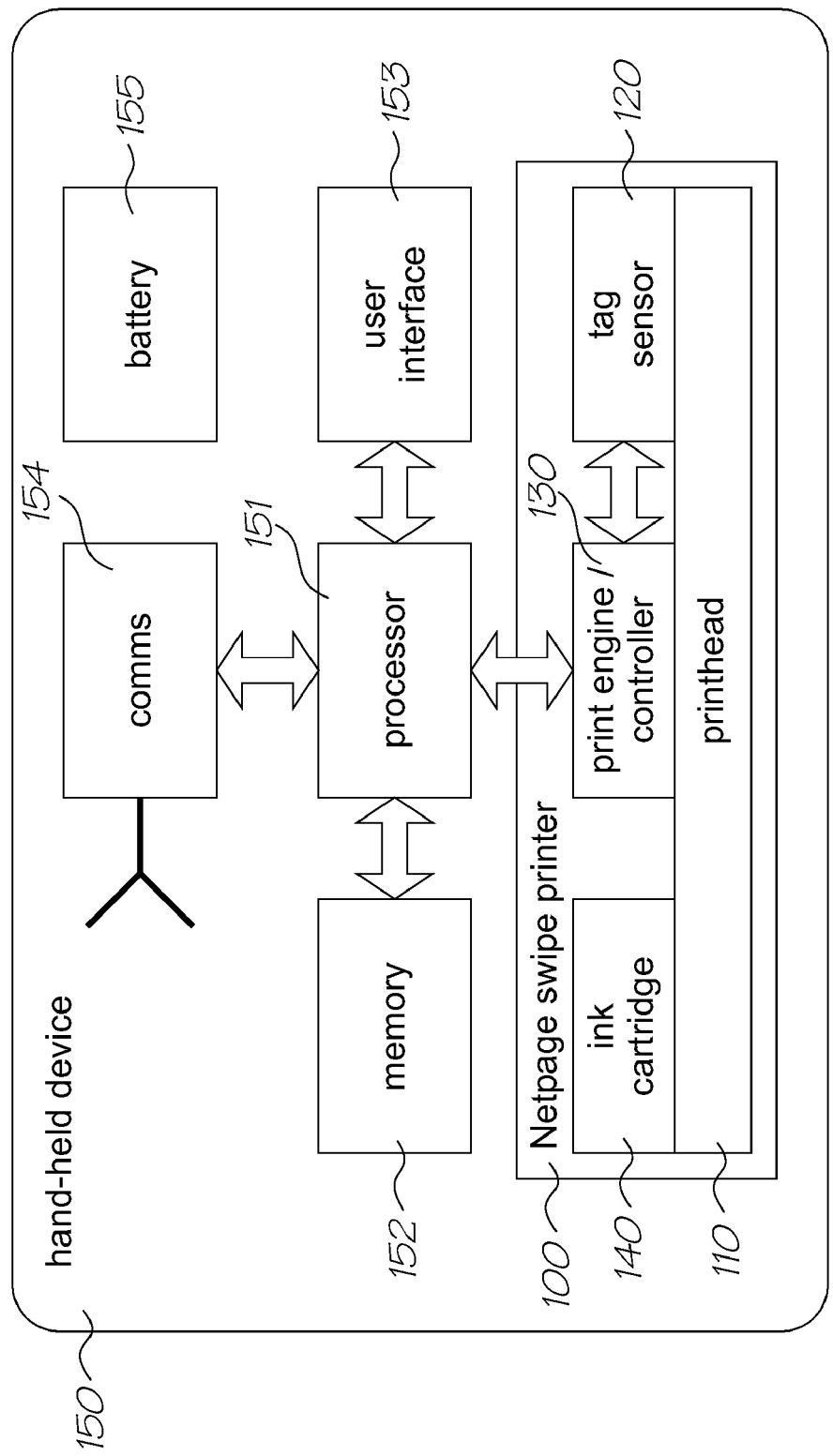
FIG. 3 shows a schematic block diagram of a Netpage swipe printer according to the present invention.

FIG. 3 shows a schematic block diagram of a Netpage swipe printer 100 incorporated in a hand-held device 150 such as a mobile phone or PDA.

The swipe printer itself consists of the printhead 110, a print engine/controller 130 that generates dot data for the printhead and controls its operation, an ink cartridge 140, and the Netpage tag sensor 120. The printhead 110 may be capable of printing one or several inks, such as a single ink (e.g. black), process colour via three or four inks (e.g. CMY or CMYK), and the Netpage tag pattern via an infrared ink.

The printhead may be a thermal or electromechanical printhead such as a Memjet printhead, as described previously by the present Applicant.

The ink cartridge 140 may incorporate memory containing a range of impression IDs for the swipe printer to use when printing Netpage tag patterns 3. The memory may be incorporated in a QA chip.

The Netpage tag sensor 120 may utilise the same design as the tag sensor in the Netpage pen, described in the Applicant's previously patents and patent applications (see, for example, U.S. Pat. No. 7,105,753; U.S. Pat. No. 7,015,901; U.S. Pat. No. 7,091,960; and US Publication No. 2006/0028459, the contents of which are herein incorporated by reference). This may be adapted for the form factor of a hand-held device such as a mobile phone or PDA, as described in US Publication No. 2005/0200638, the contents of which is herein incorporated by reference. It may also utilize a Netpage 2D contact image sensor (as described in Applicant's simultaneously co-filed applications identified in order to achieve a slimmer device profile.

The hand-held device 150 typically incorporates a microprocessor 151, program and data memory 152, a user interface 153 (e.g. touchscreen and buttons), a communications module 154 (e.g. a wireless interface such as Wi-Fi, Bluetooth, etc.), and a rechargeable battery 155.

The swipe printer 100 is usually intended for manual swiping of a page. However, robotically operated swipe printers (and swipe scanners as described below) are also within the ambit of the present invention. Accordingly, the terms "swipe printer" and "swipe scanner" include robotically-swipable printers and scanners (i.e. printers and scanners which are moved across a surface by a robot), as well as the more usual manually-swipable printers and scanners. For a more detailed description of robotically operated printers, reference is made to the Applicant's U.S. Pat. No. 7,358,697, the contents of which is herein incorporated by reference.

2.1 Swipe Printing onto Tagged Surface

If the surface already carries a Netpage tag pattern 3, then printing proceeds as follows:

The user typically initiates the printing of an image onto the surface via the user interface 153 of the device 150 that incorporates the swipe printer 100. The user interface 153 may consist of a graphical user interface shown on a display, with soft buttons or options activated via a stylus, finger or soft key. The user interface may also incorporate a dedicated hardware button for initiating printing.

The term 'image' or 'graphic image' is intended to cover any graphical content that may be printed, including text, photographs, line art, etc.

On the first swipe following initiation of printing, the swipe printer 100 determines the starting point of the swipe via the tag sensor 120, records this as the starting point for the image, and prints an appropriate portion of the image as the swipe proceeds. The swipe printer 100 can determine the extent of the page, either from the tag pattern itself or from a page description 5 associated with the page identifier encoded in the tag pattern 3, and can thus make an informed decision about the suitable placement of the image on the page. For example, it can decide to place the image so that it doesn't straddle an edge of the page. It can also orient the image so that it is placed parallel to the grid and hence the page, with the correct orientation relative to the page.

On subsequent swipes the swipe printer 100 prints additional portions of the image until the entire image has been transferred to the surface. Using the grid encoded in the tag pattern 3, the swipe printer is able to print the image in perfect registration with the grid no matter how the swipe is performed, and with perfect registration between successive swipes.

By recording exactly which portions of the image it has already printed, the swipe printer 100 is able to avoid printing any portion twice. It is also able to determine exactly when the image has been completely transferred to the surface.

On the final swipe the swipe printer 100 records the image as fully transferred, and exits printing mode.

Since the tag pattern 3 uniquely identifies the surface, the swipe printer 100 can record the status of each incomplete image transfer for future reference. It can either record the status locally, i.e. in the swipe printer or the hosting device, or it can record it on a server. The status records the image content, a map of portions that have already been transferred, the location of the image on the surface, and the identity of the surface.

When the swipe printer 100 encounters a surface location with an associated incomplete image transfer it is able to continue the image transfer even after an arbitrarily long intervening delay, and even if it has performed other image transfers since the image transfer in question was initiated.

Figure 4:
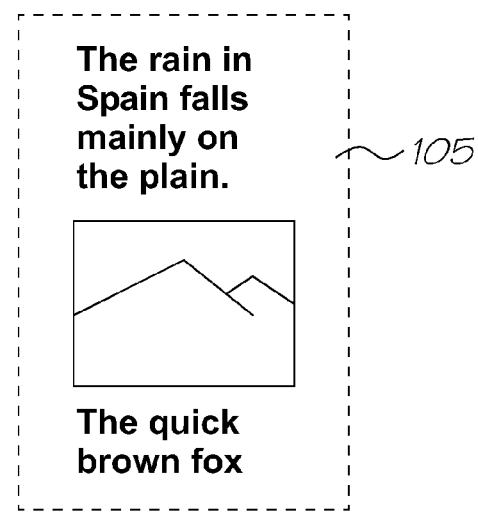
FIG. 4 shows an image to be printed.
Figure 5:
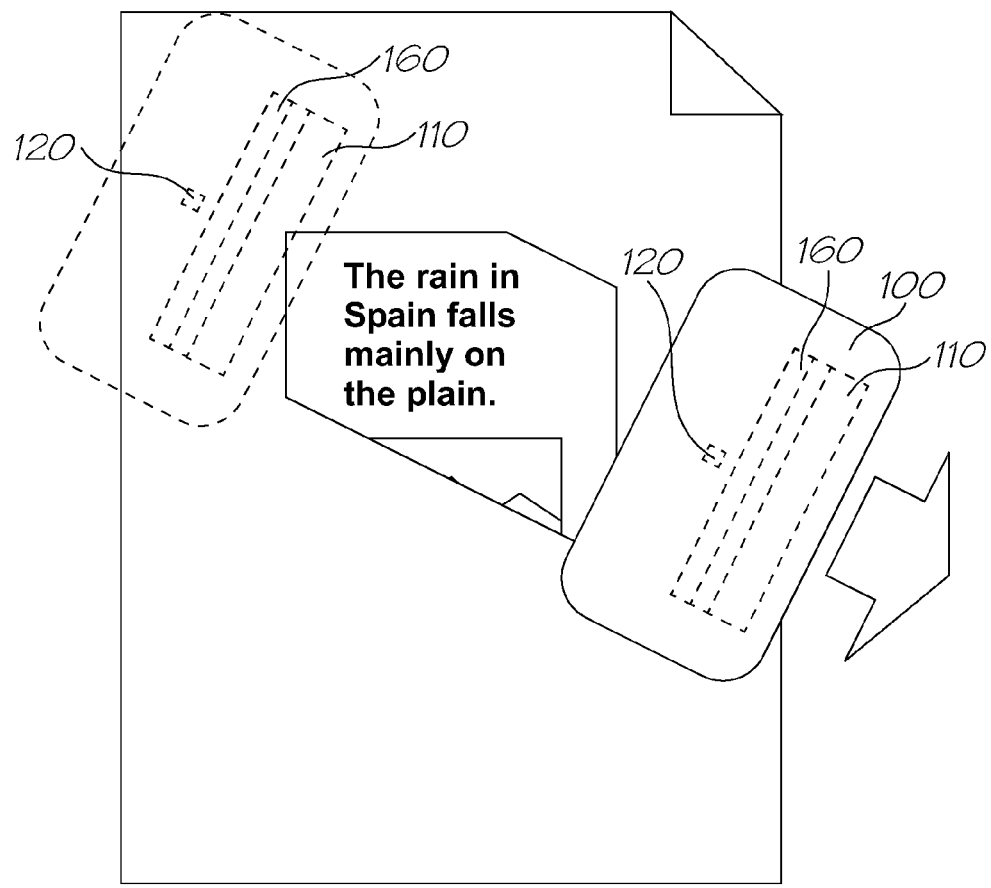
FIG. 5 shows the effect of a first swipe using the Netpage swipe printer.
Figure 6:
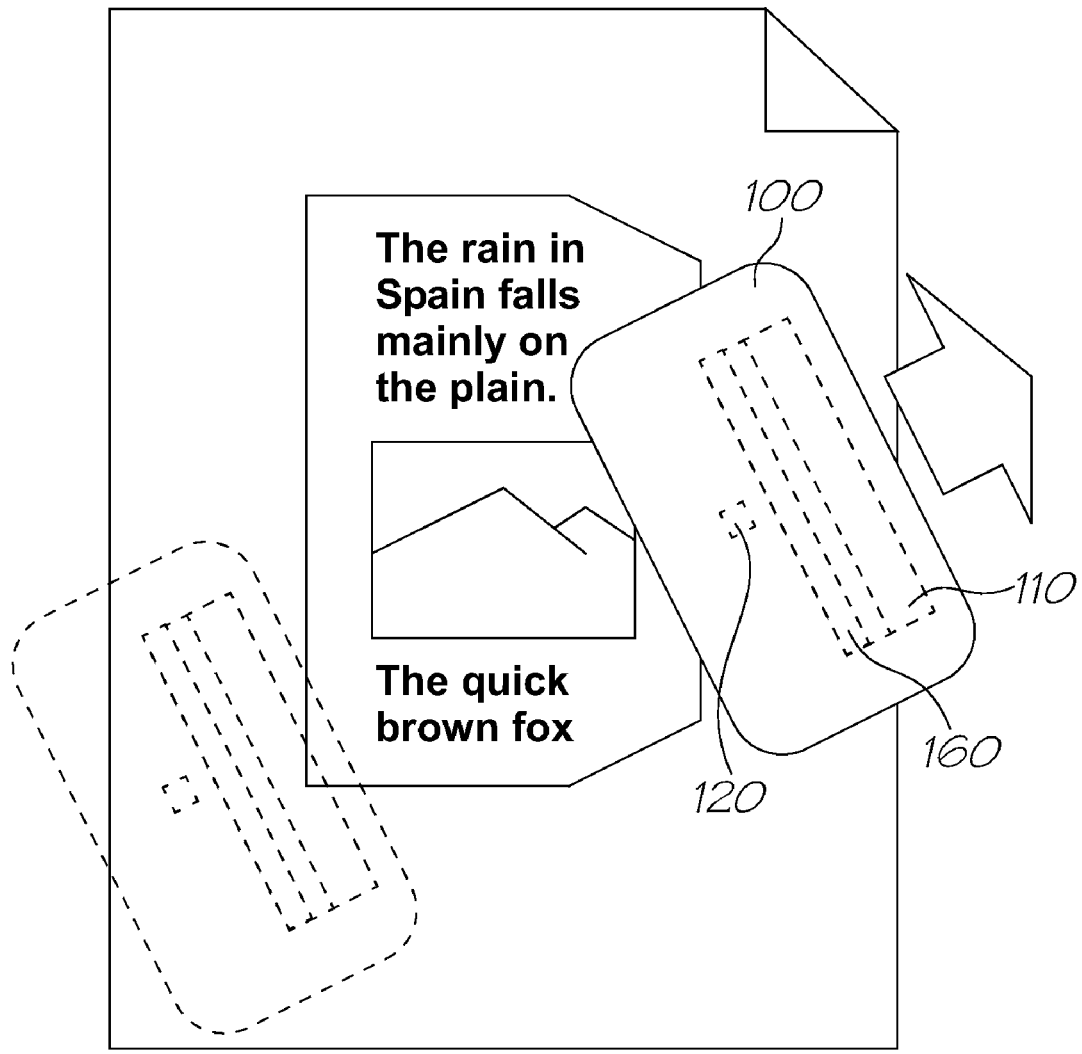
FIG. 6 shows the effect of a second swipe.

FIG. 4 shows an image 105 to be printed. FIG. 5 shows the effect of a first swipe. FIG. 6 shows the effect of a second swipe, after which the image has not quite been completely transferred.

Once printed, the image is associated with the surface in the full Netpage sense. The image can become part of the visual description of the page, and any interactivity associated with the image, such as hyperlinks, can become part of the input description of the page via the corresponding page description 5.

2.2 Swipe Printing onto Untagged Surface

If the surface does not already carry a Netpage tag pattern 3, then printing proceeds as follows:

On the first swipe following initiation of printing, the swipe printer 100 prints an appropriate portion of the image as the swipe proceeds. Since it has no absolute reference to begin with, the swipe printer 100 assumes, for example, that the user is swiping from left to right on the underlying page. The assumed swipe orientation can be set as a user preference and it will be understood that any arbitary initial swipe direction may be assumed.

As well as printing the image portion, the swipe printer 100 also prints a Netpage tag pattern 3 as it proceeds. It uses the tag sensor 120, located downstream of the printhead 110, to sense its own location and orientation relative to the tag pattern 3 it has just printed. In other words, the printhead 110 leaves a trail (or "wake") of tags 4, which can be imaged by the tag sensor 120. This allows the printhead to accurately print the image portion and tag pattern 3.

On subsequent swipes the swipe printer 100 prints additional portions of the image until the entire image has been transferred to the surface, but it only starts printing each subsequent image portion when it senses, via the tag sensor 120, a portion of the tag pattern 3 printed during an earlier swipe. The user is therefore obliged to print the image using outward swipes from an already-printed image portion.

The position-coding pattern 3 also contains an encoded impression ID, which can be associated with the graphic image being printed. The printer 100 may contain a plurality of 'spare' impression IDs in a memory, each of which can be allotted to graphic images printed by the printer. Alternatively, the printer 100 may receive an impression ID from the Netpage server 10 via its communications module 154. Hence, any graphic image printed by the swipe printer 100 can be interactive in the full Netpage sense, since a Netpage reader 400 can, on a subsequent interaction with the surface, identify the image via the impression ID as well as its own absolute location.

In order to generate interactive Netpages in this way, the swipe printer typically communicates association data to the Netpage server 10 via its communications module 154, which allows the server to create a page description 5 corresponding to the newly printed image. The association data indicates an association between the graphic image, the impression ID and the plurality of absolute positions identified by the position-coding pattern 3.

The swipe printer may include an additional motion sensor, such as an optical mouse style sensor, to obtain a relative motion signal sampled at a higher rate than the absolute motion signal of the tag sensor 120 (see U.S. application Ser. No. 12/015,507 filed on Jan. 17, 2008, the contents of which is herein incorporated by reference). As described in U.S. application Ser. No. 12/015,507, the motion sensor may be in the form of an optical mouse, which utilizes the tag image sensor to obtain images of the surface. The swipe printer 100 can combine the two signals to obtain a more precise absolute motion signal.

2.3 Swipe Scanner

The swipe printer may also incorporate a linear image sensor 160 (e.g. CCD or CMOS) for scanning an image from a surface, either in monochrome or colour. The image sensor is ideally configured parallel to and coextensive with the printhead 110, so that a printing swipe and a scanning swipe are equivalent. The linear image sensor may also be incorporated in the printhead itself, as described in U.S. Pat. No. 7,140,792, the contents of which is herein incorporated by reference. For convenience, swipe printers comprising a linear image sensor of this type are termed 'swipe scanners'.

If the surface is not tagged then the swipe printer can print a tag pattern 3 onto the surface as it proceeds in order to provide itself with an absolute position reference. This absolute position reference allows the plurality of successive images captured by the linear image sensor 160 to be assembled accurately into a scanned graphic image.

The printhead 100 can either transfer the tag pattern 3 onto the surface prior to scanning an image within the tagged area, or it can transfer the tag pattern to the surface while it scans, in direct analogy with the way it prints an image onto an un-tagged surface. In this case the user is obliged to swipe outwards from the tagged region where scanning was initiated.

On the first swipe of an untagged surface, there is a time delay between the start of printing and when the tag sensor 120 first sees a valid tag pattern. This time delay is the product of the swipe speed and the distance between the printhead 110 and the far edge of the tag sensor 120. One or more relative motion sensors can be used to ensure proper registration during this time interval. Using two relative motion sensors rather than just one allows rotation information to be more easily recovered. Of course, in the robotic swipe scanner, the swipe speed will be known and motion sensors may not be required to determine the swipe speed.

The Netpage tag sensor 120 can be used as a relative motion sensor in the absence of a tag pattern, using interframe surface texture correlation in the same way as an optical mouse.

If the surface is tagged then there are two ways the swipe printer can scan the image. It can use surface identity to look up the corresponding page description 5 on a Netpage server 10, and use the location to extract a portion of the page description. Alternatively, it can scan portions of the image directly from the surface during one or more swipes, and combine them in direct analogy with the way it prints an image onto the surface during one or more swipes.

2.3.1 Conferring Interactivity on Pre-Printed Graphic Images

As explained above, the swipe scanner may be used to scan a pre-printed graphic image and print a position-coding pattern onto the image. In this way, the swipe-scanner, together with the Netpage server 10, may be configured to confer interactivity on the pre-printed graphic image by analogy with the swipe printer.

The position-coding pattern 3, printed by the swipe-scanner, contains an encoded impression ID, which may be associated with the graphic image being scanned by the scanner. The scanner 100 may contain a plurality of 'spare' impression IDs in a memory, each of which can be allotted to graphic images scanned by the scanner. Alternatively, the scanner may receive an impression ID from the Netpage server 10 via its communications module 154. Hence, any pre-printed graphic image scanned by the swipe scanner may be made interactive in the full Netpage sense, since a Netpage reader 400 can, on a subsequent interaction with the surface, identify the image via the impression ID as well as its own absolute location.

In order to generate interactive Netpages in this way, the swipe scanner typically communicates association data to the Netpage server 10 via its communications module 154, which allows the server to create a page description 5 corresponding to the scanned graphic image. The association data indicates an association between the scanned graphic image, the impression ID and the plurality of absolute positions identified by the position-coding pattern 3.

Interactive elements may be manually associated with zones of the scanned graphic image by a user. For example, hyperlink zones contained in the scanned graphic image may be associated with corresponding URIs by a user and stored as part of the page description 5 for the graphic image. Likewise, input field zones (e.g. text entry fields) may be associated with corresponding input fields in the page description.

2.3.2 Automatically Conferring Interactivity on Pre-Printed Graphic Images

As an alternative to manually associating interactive elements with zones of the graphic image, the Netpage server 10 may use Optical Character Recognition (OCR) to confer interactivity automatically and without user intervention. For example, OCR may be used to identify URI text strings, and hence URIs, (e.g. www.example.com) in the scanned graphic image. The Netpage server 10 can then generate automatically an input description for the scanned graphic image. The input description may describe a zone of the URI text string in the scanned graphic image and its corresponding URI. This input description, together with the scanned graphic image, is stored as the page description 5 for the pre-printed graphic image. Hence, scanning/printing of pre-printed graphic images can allow automatic Netpage hyperlinking from the printed page, even though the graphic image as originally printed had no such interactivity.

Even if the scanned graphic image does not contain any identifiable URI text strings, OCR technology may still be used to confer useful interactivity on the printed graphic image. As described in the Applicant's copending US Publication No. 2007/0146322 (the contents of which is herein incorporated by reference), text-based keyword searches and copy/paste operations may be initiated from printed substrates, and still enable users to receive useful information in the absence of explicit hyperlink zones on the page.

Thus, using OCR technology, text images in the scanned graphic image may be converted into computer text (e.g. Unicode, ASCII etc), and the computer text stored as part of the input description for the pre-printed graphic image. Typically, the input description describes words of computer text and zones of corresponding text images in the scanned graphic image. The zones may be described explicitly with reference to coordinate positions, or they may be inferred from the computer text using one or more of: a length of a word, a point size, and a position of the word in the computer text. Likewise, the zones of URI text strings may be inferred in the same way.

The corresponding page description 5 comprises the scanned graphic image and the input description for that graphic image. Of course, the input description may describe URIs, as described above, as well as computer text.

With the page description storing computer text in this way, text-based searching may proceed similarly to the method described in US Publication No. 2007/0146322. For example, a user may interact with a printed word (or words) of text using a Netpage reader 400 and read part of the position-coding pattern 3 (e.g. one or more tags 4). Interaction data, identifying the impression identity and a position, is sent from the Netpage reader 400 to the Netpage server 10 in the usual way. The impression identity is used to retrieve the corresponding page description 5 and identify the word(s) of text using the position(s) of the reader. A search query is generated, which contains one or more keywords. The search query typically contains one or more of the words indicated by the Netpage reader interaction, and may additionally contain contextual keywords, identified using the page description 5, in order to enhance the search. Contextual keywords may, for example, be derived from a sentence or paragraph containing the indicated word(s). A more detailed description of contextualized Netpage searching may be found in the Applicant's copending US Publication No. 2007/0146322.

With the search query generated, the Netpage server 10 initiates a search using, for example, an Internet keyword search engine (e.g. Google, Yahoo!, Wikipedia etc). The Netpage server 10 may initiate the search directly by sending a request URI to a search engine, or it may simply send the request URI to the user's web browser, which can then perform the search. Suitable Netpage architectures for initiating such searches are described in US Publication No. 2007/0146322. Finally, the user receives the search results, typically in the form of a webpage containing the search results.

Page descriptions describing computer text may also be used to initiate text-based copy/paste operations via the printed graphic image, as also described in US Publication No. 2007/0146322. In this scenario, interaction data is sent from the Netpage reader 400 to the Netpage server 10 in the usual way and the page description 5 is used to identify word(s) of computer text, which are then copied to a clipboard. Of course, the contents of the clipboard may be subsequently pasted to a suitable application.

Image-based copy/paste operations may, of course, be performed without OCR of the scanned graphic image. Thus, an image may be selected by, for example, a lasso gesture of the Netpage reader 400 and copied to a clipboard. The selected image is identified with reference to the page description, which, in this case may, simply describe the scanned graphic image without any explicit description of computer text or interactive zones. Nevertheless, subsequent OCR on the image-clipping stored in the clipboard may be used to to generate corresponding computer text, which can be subsequently pasted into an application.

In connection with the above, it will be understood that hyperlinks and computer text may be discovered "lazily" by the Netpage server 10. In other words, when the user actually clicks on a location on a page, the server can determine if the click coincides with word(s) of text and/or the zone of a URI text string by performing OCR on-demand on at least part of the scanned graphic image described in the page description.

Text-based searching, text-based copy/paste operations and hyperlinking may each be distinguished via the Netpage reader 400 and/or the Netpage server 10. For example, a gesture (e.g. lasso, swipe, underline, click etc) or mode selection may be used to distinguish different types of interaction, as described in detail in US Publication No. 2007/0146322.

2.4 Other Netpage Scanners For Automatically Conferring Interactivity on Pre-Printed Graphic Images As described above in Sections 2.3.1 and 2.3.2, Netpage interactivity may be conferred on pre-printed graphic images using the swipe scanner 100, which typically prints the position-coding pattern 3 at the same time as swipe-scanning the pre-printed graphic image. A number of alternative systems for conferring interactivity on pre-printed graphic images may be also be used, as described below.

2.4.1 Modified Netpage Printer

Netpage printers, which are configured for substantially simultaneous printing of graphic images and a position-coding pattern 3 are described in, for example, U.S. Pat. Nos. 7,233,320, 6,727,996 & 6,870,966, the contents of which are herein incorporated by reference. In the Netpage printer described previously by the present Applicant, the printer receives a visual description for a graphic image together with a page identity from the Netpage server 10. The printer generates CMYK dot data for the graphic image and simultaneously generates IR dot data for the position-coding pattern 3. A stationary pagewidth printhead in the Netpage printer has a dedicated IR channel for printing the position-coding pattern 3 as well as the usual CMYK color channels. Hence, the Netpage printer is capable of simultaneously printing graphic images with the position-coding pattern 3 so as to create an interactive netpage 1.

Netpage printers may be modified to include a linear image sensor (typically a stationary pagewidth scanhead) in order to confer Netpage interactivity on graphic images in a similar way to the swipe scanner described above in Section 2.3. The skilled person will readily appreciate how such printers may be modified to include a pagewidth scanhead, which may be positioned, for example, adjacent a pagewidth printhead in the printer.

Netpage printers modified with a pagewidth scanhead have the advantage that any page received by the printer, which bears a pre-printed graphic image, may be tiled with the position-coding pattern and simultaneously scanned by the scanhead so as to confer Netpage interactivity on the page. Moreover, since a timing relationship between the printhead and the scanhead is fixed (by virtue of a common paper feed mechanism), accurate registration between the scanned image and the position-coding pattern 3 is ensured.

Figure 7:
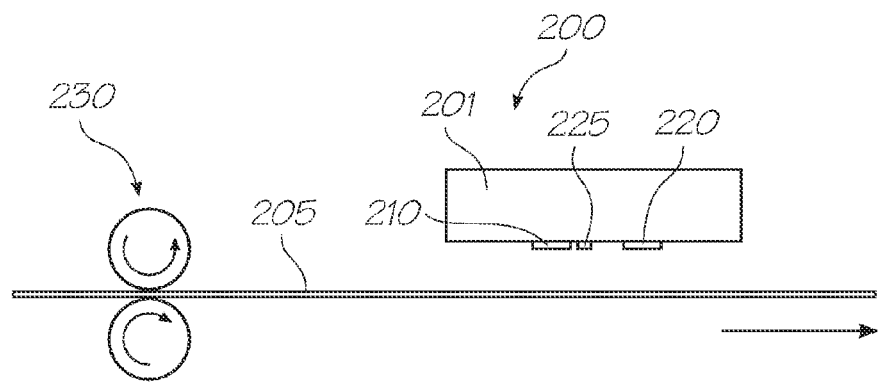
FIG. 7 shows schematically a Netpage printer including a pagewidth scanhead.

FIG. 7 shows schematically a modified Netpage printer 200 having a printhead assembly 201, which includes a pagewidth printhead 210 for printing the position-coding pattern 3 onto a print medium 205, and a pagewidth scanhead 220 for scanning pre-printed graphic images on the print medium. As shown in FIG. 7, the scanhead 220 is positioned downstream of the printhead in the sense that scanning occurs after printing. However, the scanhead 220 may alternatively be positioned upstream of the printhead, since the timing relationship between printing and scanning is fixed by the feed mechanism 230. The feed mechanism 230 feeds print media 205, bearing pre-printed graphic images, past the printhead 210 and scanhead 220 at a known constant speed.

In addition, the printhead assembly 201 may include a tag image sensor 225, positioned downstream of the printhead 210 and upstream of the scanhead 220, which reads part of the position-coding pattern 3 immediately after it is printed by the printhead. By analogy with the swipe-scanner 100, the tag image sensor 225 may be used to provide the best possible registration between the scanned image and the position-coding coding pattern 3, even though registration is achievable from the known speed of the print medium 205.

By further analogy with the swipe scanner 100, the modified Netpage printer 200 may allocate an impression ID to each scanned page from a store of impression IDs contained in the printer or from a server allocating impression IDs on-demand. The impression ID is encoded into the position-coding pattern 3, which is printed by the printer during scanning. Likewise, the printer may generate association data for each scanning/printing job and communicate this association data to the Netpage server 10. The association data indicates an association between the scanned graphic image, the impression ID and the plurality of absolute positions identified by the position-coding pattern 3. This enables the Netpage server 10 to generate a page description 5 for the scanned graphic image, optionally using OCR to identify text strings and/or hyperlinks, as described above.

2.4.2 Modified Flatbed Scanner

Flatbed scanners are well-known devices used to scan pre-printed graphic images and convert the scanned image into a digital image. The digital image may be saved to a user's desktop in a suitable format e.g. pdf In a typical flatbed scanner, a page bearing a graphic image is placed faced down on a glass platen and a pagewidth scanhead, mounted on a carriage, traverses across the page and scans the image. The page is typically illuminated through the glass platen using any suitable light source.

Figure 8:
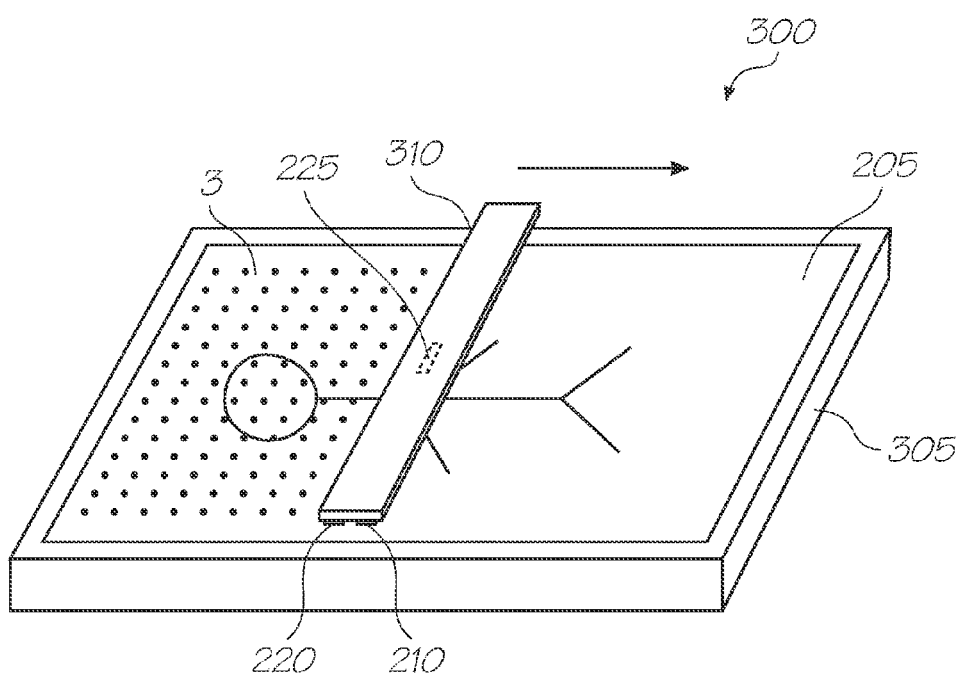
FIG. 8 shows schematically a flatbed scanhead incorporating a printhead.

A flatbed scanner may be modified to include a printhead, which prints the position-coding pattern 3 onto the pre-printed graphic image during scanning. Referring to FIG. 8, there is shown a modified flatbed scanner 300 comprising a platen 305, on which is placed a print medium 205 bearing a pre-printed graphic image. A traversing carriage 310 has a pagewidth printhead 210 and a pagewidth scanhead 220 mounted thereon. As the carriage 310 traverses across the print medium 205 in the direction of the arrow, the position-coding pattern 3 is printed onto the print medium by the printhead 210, and the graphic image is scanned by the scanhead 220. Of course, a non-printing mode is equally possible, in which case the scanner 300 functions as conventional flatbed scanner. Typically, the carriage 310 incorporates an ink supply (e.g. inkjet ink or toner supply for the printhead 210).

The scanner 300 has a processor (which may be contained in the carriage 310) configured to generate association data by analogy with both the swipe scanner 100 and the modified Netpage printer 200 described above. Since the carriage 310 moves at a known constant speed, registration between the position-coding pattern 3 and the scanned graphic image is generally ensured. However, the carriage 310 may also have a tag image sensor 225 mounted thereon, positioned downstream of the printhead 210, for reading the part of the position-coding pattern 3 just printed by the printhead during a traverse of the carriage 310. By reading the position-coding pattern 3 with the tag image sensor 225, the best possible registration between the scanned image and position-coding pattern can be achieved.

2.4.3 Printing a Position-Coding Pattern onto Graphic Image with Subsequent Scanning In each of the swipe scanner 100, the modified Netpage printer 200 and the modified flatbed scanner 300 described above, the respective device prints the position-coding pattern 3 and scans the graphic image at substantially the same time. Once the position-coding pattern 3 is printed and the scanned image acquired, the device generates association data indicating an association between the scanned graphic image, an impression ID allocated to the scanned image and the plurality of absolute positions identified by the position-coding pattern 3. This association data is communicated to the Netpage server 10, enabling creation of a page description 5, optionally in combination with OCR techniques to enhance the degree of Netpage interactivity achievable with the printed page.

In an alternative scenario, the Netpage printer (as described in, for example, U.S. Pat. Nos. 7,233,320, 6,727,996 & 6,870,966) may be configured to print in a 'tag-only' mode. In this mode, the printer allocates an impression ID to a page (either from an internal supply of 'spare' impression IDs or on request from the Netpage server 10) and simply prints the position-coding pattern 3 via its IR channel onto a pre-printed graphic image. The user may manually select a 'tag-only' mode if the printer is receiving print media bearing pre-printed graphic images, which are desired to acquire Netpage interactivity.

It should be noted that, unlike the usual printing mode of the Netpage printer, in the 'tag-only' mode, the printer does not generally print any graphic images via its CMYK channels, although the page may be visibly marked to indicate that the position-coding pattern 3 has been printed, particularly if the pattern is invisible to the naked eye. Moreover, the standard Netpage printer is not equipped with the scanhead 220, described in Section 2.4.1, and so no scanning of the pre-printed graphic images can occur.

At the time of printing the position-coding pattern 3 in 'tag-only' mode, the impression ID encoded into the position-coding pattern 3 is typically 'unknown' to the Netpage server 10 in the sense that it has not yet been associated with a visual description of the pre-printed graphic image e.g. a scanned digital version of the pre-printed graphic image. Hence, the resultant substrate, having the graphic image and the position-coding pattern 3, will not be interactive immediately after printing in 'tag-only' mode, because the impression ID does not have a corresponding page description 5 stored in the Netpage server 10.

Figure 9:
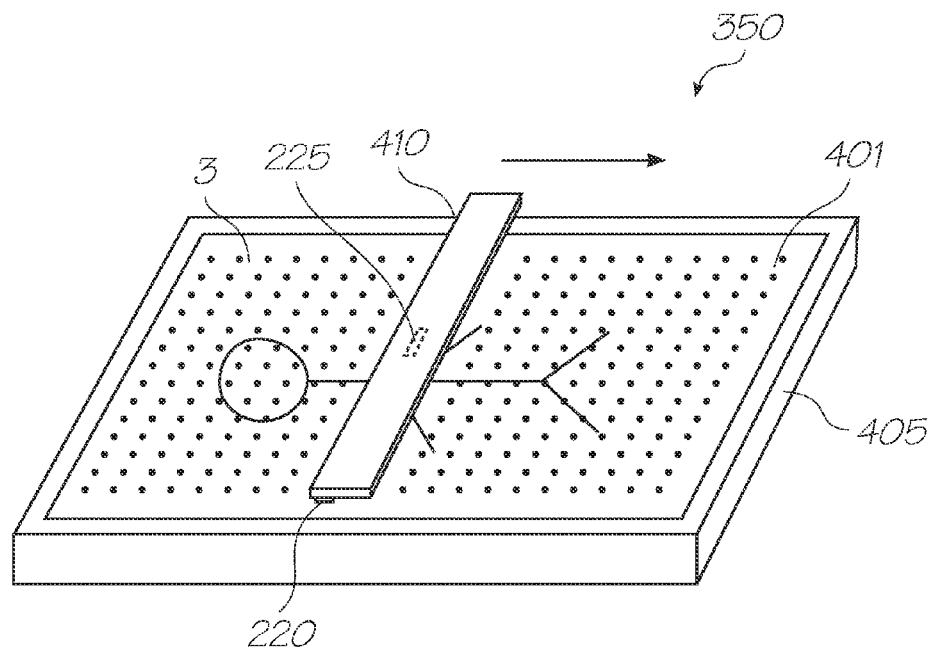
FIG. 9 shows schematically a flatbed scanhead with an optical tag sensor.
Figure 10:
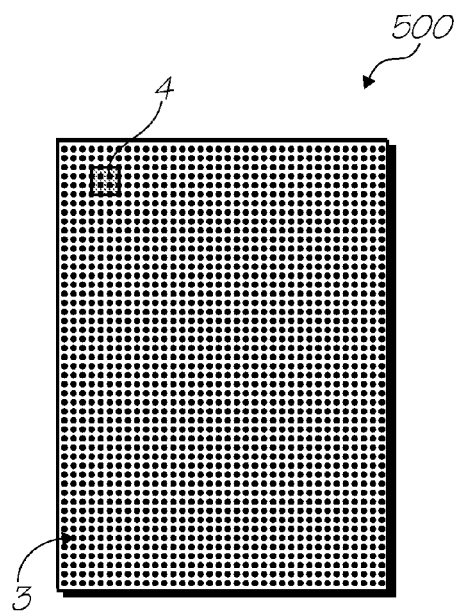
FIG. 10 shows a transparency having a position-coding pattern.

Substrates which have been printed in 'tag-only' mode may be made interactive by a suitable Netpage scanner. By way of example, a flatbed Netpage scanner 350 is shown in FIG. 9, although the swipe scanner 100 configured for reading a tagged surface (described in Section 2.3) may equally be used.

The flatbed Netpage scanner 350 typically comprises a carriage 410 on which is mounted a pagewidth scanhead 220 and a tag image sensor 225 for reading part of the position-coding pattern 3. In use, a substrate 401 having the graphic image and the position-coding pattern 3 is placed on a platen 405, and the carriage 410 traverses across the substrate 401 as shown in FIG. 9. During traversal of the carriage 410, the tag image sensor 225 reads part of the position-coding pattern 3 whilst the scanhead 220 scans the graphic image. The tag image sensor 225 may be integrated with the printhead, as described in US Publication No. 2005/0219299, the contents of which is herein incorporated by reference.

After scanning, the Netpage scanner 350 can then generate association data indicating an association between the impression ID (as read from the position-coding pattern 3), the plurality of absolute positions and the scanned graphic image. The association data is generated by a suitably configured processor, which may, for example, be contained in the carriage 410.

The association data is then communicated to the Netpage server 10, which can create a page description 5 in the usual way. Although in FIGS. 8 and 9, the position-coding pattern 3 is shown as a grid of dots for clarity, this position-coding pattern would, in practice, be printed with an IR-absorbing ink, which is typically invisible or hardly visible to the naked eye.

Of course, conventional inkjet printers incorporating flatbed scanners are well known in the art. Similarly, a Netpage printer may incorporate the flatbed Netpage scanner 350 to provide a highly versatile device, which can perform all the usual functions of the Netpage printer, as well as enabling Netpage interactivity to be conferred on pre-printed graphic images via 'tag-only' printing and subsequent Netpage scanning as described above.

The Netpage scanner 350 may also be useful if the position-coding pattern 3 encodes an impression ID, which is known to the Netpage server 10 and for which a corresponding page description 5 already exists. By scanning the graphic image, reading the impression ID and retrieving the corresponding page description 5, a comparison between the visual description (stored in the page description 5) and the scanned graphic image (acquired by the Netpage scanner 350) may be made by the Netpage server 10. Based on this comparison, the Netpage server 10 can determine if, for example, the graphic image has been annotated and then, optionally, store these annotations as a separate layer with the visual description of the page. This is particularly useful if the page has been annotated using a normal (i.e. non-Netpage) marking pen, meaning that the annotations would be unknown to the Netpage server 10. A similar means for determining pen annotations was described by the present Applicant in U.S. Pat. No. 7,110,126, the contents of which is herein incorporated by reference.

2.4.4 Adhering a Position-Coding Pattern onto Graphic Image with Subsequent Scanning As an alternative to printing the position-coding pattern 3 in 'tag-only' mode, a substrate having a pre-printed graphic image may have a transparency 500 with an adhesive backing attached thereto. The adhesive transparency 500 carries a position-coding pattern 3, which encodes an impression ID together with a plurality of absolute positions. A plurality of transparencies 500 may be manufactured, each having its own unique 'blank' impression ID, which can be subsequently associated with a page or graphic image.

Once the transparency 500 is adhered to a substrate having a pre-printed graphic image, the substrate may be scanned using, for example, the Netpage flatbed scanner 350 or the swipe scanner 100, enabling the creation of a corresponding page description 5. The Netpage scanner 350 treats the substrate-transparency assembly in exactly the same way as the tagged substrate 401, where the impression ID is unknown to the Netpage server 10, as described above in Section 2.4.3.

Transparencies of this type may be useful in situations where a substrate cannot be easily fed through a Netpage printer e.g. some non-paper substrates, bound pages of book etc. The transparency may be either permanently or removably attached to the substrate.

The present invention has been described with reference to a preferred embodiment and number of specific alternative embodiments. However, it will be appreciated by those skilled in the relevant fields that a number of other embodiments, differing from those specifically described, will also fall within the spirit and scope of the present invention. Accordingly, it will be understood that the invention is not intended to be limited to the specific embodiments described in the present specification, including documents incorporated by cross-reference as appropriate. The scope of the invention is only limited by the attached claims.

The invention claimed is:

1. A swipe printer configured for printing in a swipe direction, the swipe printer comprising:
   a printhead for printing a graphic image and a position-coding pattern onto a surface;
   an ink supply containing at least one first ink for printing the graphic image and a second ink for printing the position-coding pattern;
   at least one first image sensor positioned downstream of said printhead relative to the swipe direction, said first image sensor being configured for imaging portions of said printed surface on which said printhead has printed during a swipe of the surface, each imaged portion containing part of the position-coding pattern printed by said printhead during said swipe; and
   a processor configured for:
      determining absolute positions of the swipe printer using said imaged parts of the position-coding pattern; and
      controlling an output of said printhead during said swipe using the determined absolute positions
   wherein the printhead is configured to print the position-coding pattern as a trail such that each portion of the printed surface imaged by the first image sensor contains part of the position-coding pattern.

2. The swipe printer of claim 1, wherein said second ink is an infrared-absorbing ink.

3. The swipe printer of claim 2, wherein the first ink has an infrared window enabling said first image sensor to image said position-coding pattern in the presence of the first ink.

4. The swipe printer of claim 1, which is configured for unidirectional swiping.

5. The swipe printer of claim 1, further comprising a motion sensor for sensing relative motion of the printer.

6. The swipe printer of claim 5, wherein said processor is configured to use the sensed relative motion together with said absolute positions to control the output of the said printhead.

7. The swipe-printer of claim 1, wherein said position-coding pattern further identifies an orientation of position data relative to a grid containing said position data.

8. The swipe printer of claim 7, wherein said processor is configured to use said part of the position-coding pattern to determine an orientation of the printer relative to said grid, and to use said orientation together with said absolute position to control the output of the said printhead.

9. The swipe printer of claim 1, wherein said position-coding pattern further identifies an impression identity associated with said graphic image.

10. The swipe printer of claim 1, further comprising a first memory for storing a plurality of impression identities, each stored impression identity being associable with a graphic image.

11. The swipe printer of claim 1, further comprising communication means for communicating with a computer system.

12. The swipe printer of claim 11, wherein said processor is configured to generate association data for communication to the computer system, said association data indicating an association between the impression identity and the graphic image such that said graphic image printed by said printer is interactive.

13. The swipe printer of claim 12, wherein said association data enables said computer system to associate one or more zones of the graphic image with a corresponding interactive element.

14. The swipe printer of claim 13, wherein said interactive element is selected from the group comprising: a hyperlink, an input field and a button.

15. The swipe printer of claim 14, wherein said second image sensor is positioned parallel and/or substantially coextensive with said printhead.

16. The swipe printer of claim 1, further comprising a second image sensor configured for scanning the graphic image printed by said printer.

17. The swipe printer of claim 1, wherein said printhead is configured for printing the graphic image and the position-coding pattern substantially simultaneously onto said surface during said swipe.

18. A handheld device comprising the swipe printer according to claim 1.

19. The handheld device of claim 18, which is selected from the group comprising: a mobile phone and a personal digital assistant.

* * * * *